(12) United States Patent  
Kokura

(10) Patent No.: US 7,416,988 B2
(45) Date of Patent: Aug. 26, 2008

(54) SEMICONDUCTOR DEVICE AND FABRICATION PROCESS THEREOF

(75) Inventor: Hikaru Kokura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 329 days.

(21) Appl. No.: 10/991,498

(22) Filed: Nov. 19, 2004

(65) Prior Publication Data

US 2006/0046493 A1 Mar. 2, 2006

(30) Foreign Application Priority Data

Aug. 26, 2004 (JP) ............................. 2004-247143

(51) Int. Cl.
*H01L 21/302* (2006.01)
*H01L 21/461* (2006.01)
(52) U.S. Cl. ............................. 438/705; 257/E21.252; 257/E21.279
(58) Field of Classification Search ................. 438/705; 257/E21.252
See application file for complete search history.

(56) References Cited

U.S. PATENT DOCUMENTS

| 5,306,671 | A | * | 4/1994 | Ogawa et al. ................ 438/595 |
| 5,383,984 | A | * | 1/1995 | Shimada et al. ........ 156/345.26 |
| 5,427,971 | A | * | 6/1995 | Lee et al. ..................... 438/303 |
| 5,480,492 | A | * | 1/1996 | Udagawa et al. ................ 134/2 |
| 5,762,813 | A | * | 6/1998 | Takiyama et al. ............. 216/67 |
| 5,902,134 | A | * | 5/1999 | Egashira ..................... 438/723 |
| 6,037,266 | A | * | 3/2000 | Tao et al. ..................... 438/719 |
| 6,214,736 | B1 | * | 4/2001 | Rotondaro et al. ........... 438/705 |
| 6,284,664 | B1 | * | 9/2001 | Kawai ......................... 438/710 |
| 6,303,482 | B1 | * | 10/2001 | Wu et al. ..................... 238/592 |
| 6,432,830 | B1 | * | 8/2002 | Merry ......................... 438/706 |
| 6,455,333 | B1 | * | 9/2002 | Khathuria ..................... 438/9 |
| 6,599,438 | B2 | * | 7/2003 | Levenson et al. .............. 216/67 |
| 6,638,855 | B1 | * | 10/2003 | Chang et al. ................. 438/637 |
| 2002/0006711 | A1 | * | 1/2002 | Yamazaki et al. ........... 438/471 |
| 2002/0072016 | A1 | * | 6/2002 | Chen et al. ................... 430/323 |
| 2002/0072233 | A1 | * | 6/2002 | Sueyoshi ..................... 438/684 |
| 2002/0160617 | A1 | * | 10/2002 | Chen et al. ................... 438/704 |
| 2003/0087512 | A1 | * | 5/2003 | Cheong ....................... 438/595 |

FOREIGN PATENT DOCUMENTS

JP 8-78352 3/1996
JP 9-129602 5/1997

OTHER PUBLICATIONS

Kazuo Hashimi et al., Jpn. J. Appl. Phys. vol. 35, (1996) No. 4B pp. 2494-2500.

* cited by examiner

*Primary Examiner*—Bradley Baumeister
*Assistant Examiner*—Igwe U. Anya
(74) *Attorney, Agent, or Firm*—Westerman, Hattori, Daniels & Adrian, LLP.

(57) ABSTRACT

A method of fabricating a semiconductor device includes the steps of modifying a damaged layer containing carbon and formed at a semiconductor surface by exposing the damaged layer to oxygen radicals to form a modified layer, and removing the modified layer by a wet etching process, wherein the modifying step is conducted by adding an active specie of an element that would obstruct formation of double bond between a Si atom and an oxygen atom by causing a chemical bond with Si atoms on the semiconductor surface.

18 Claims, 21 Drawing Sheets

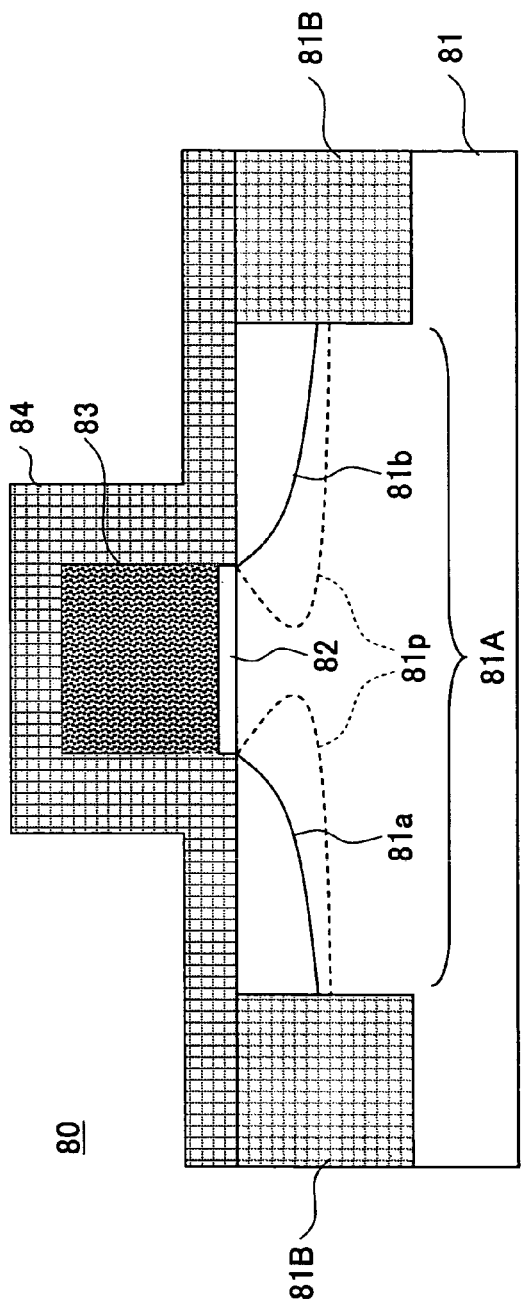
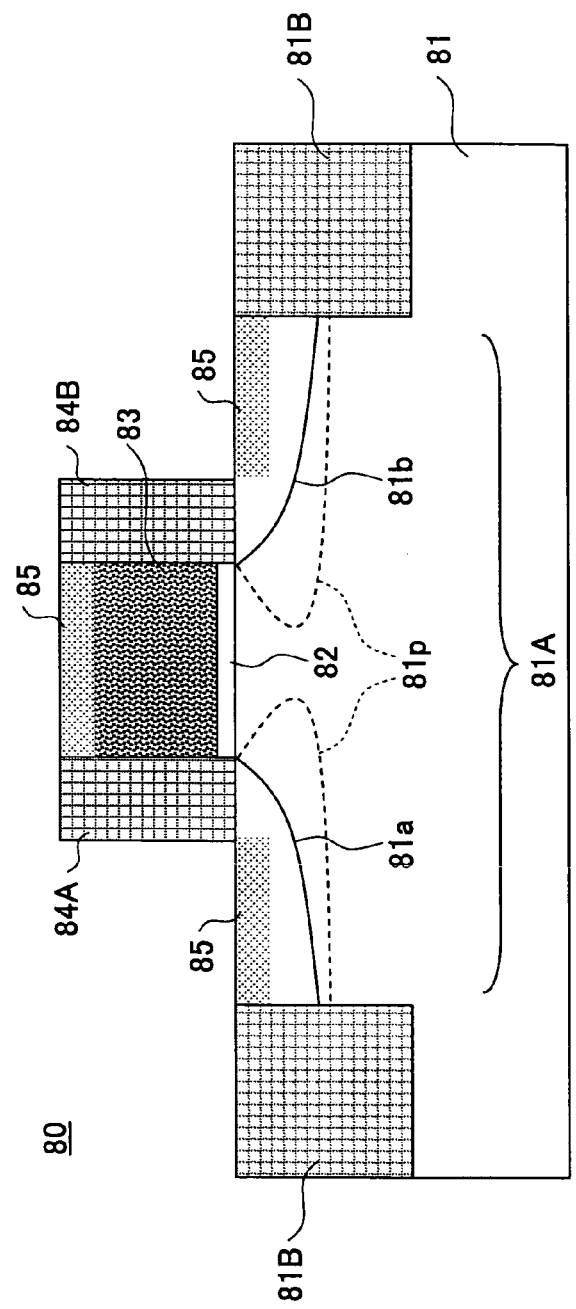
FIG.10C
FIG.10D

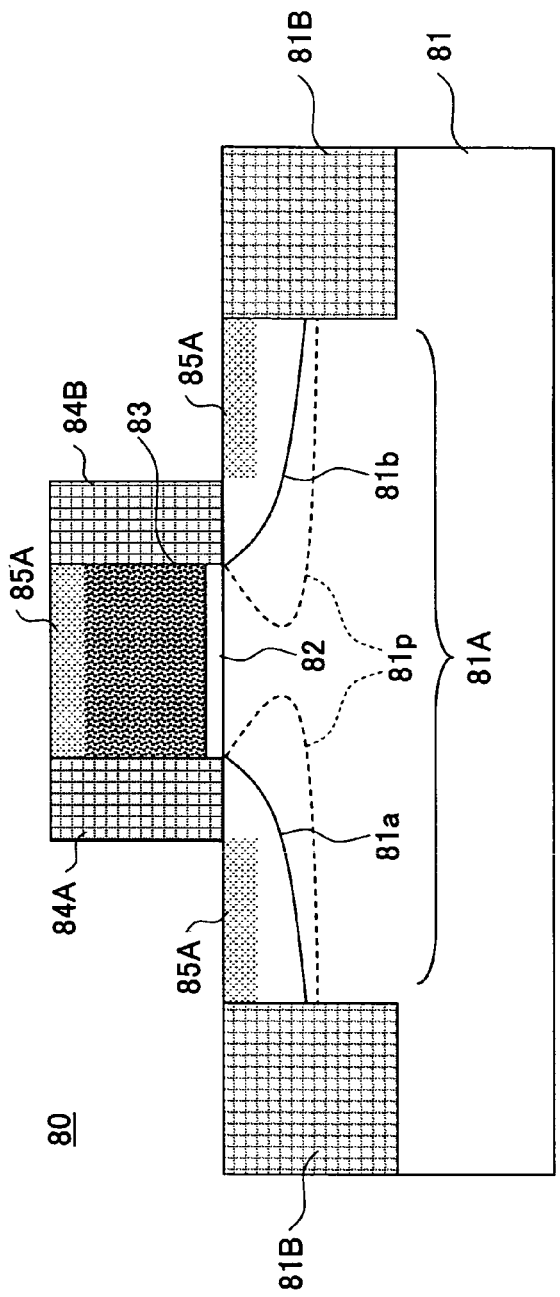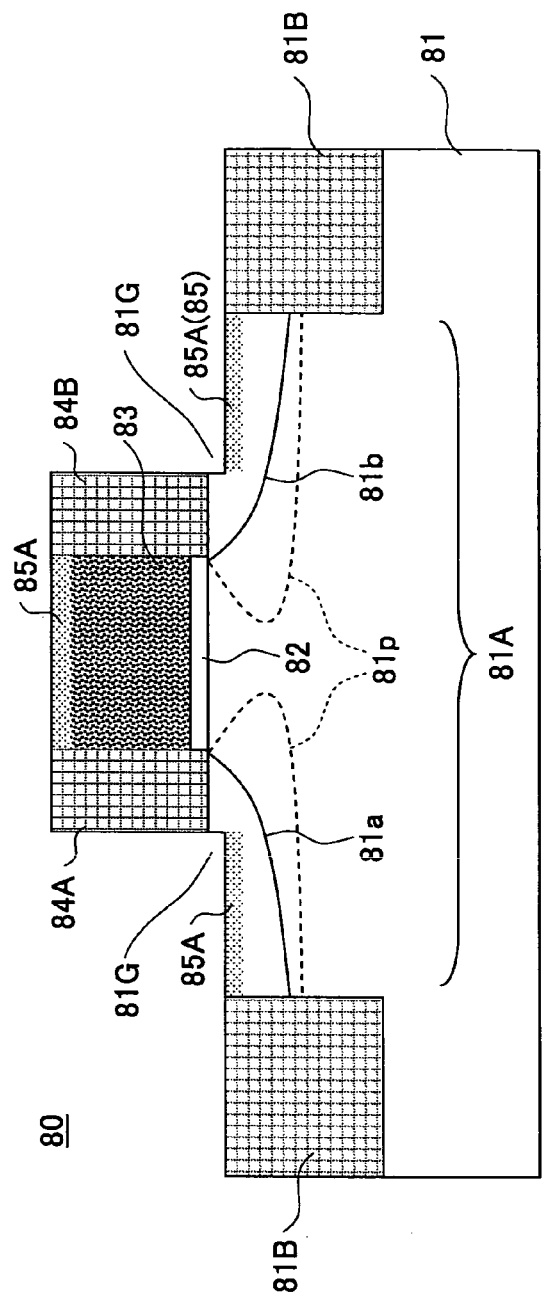

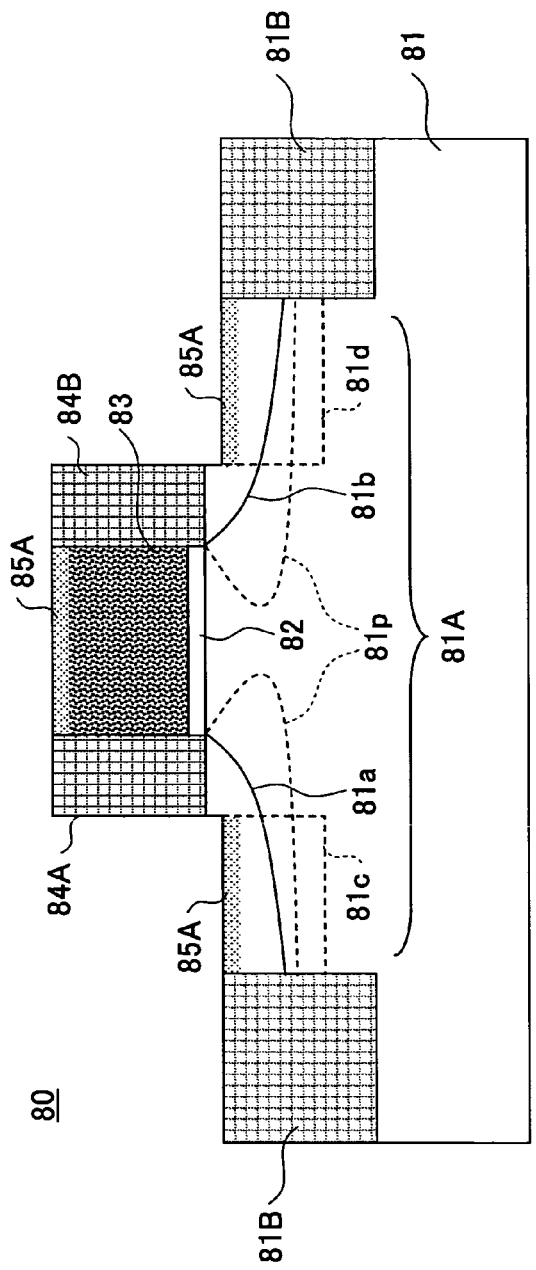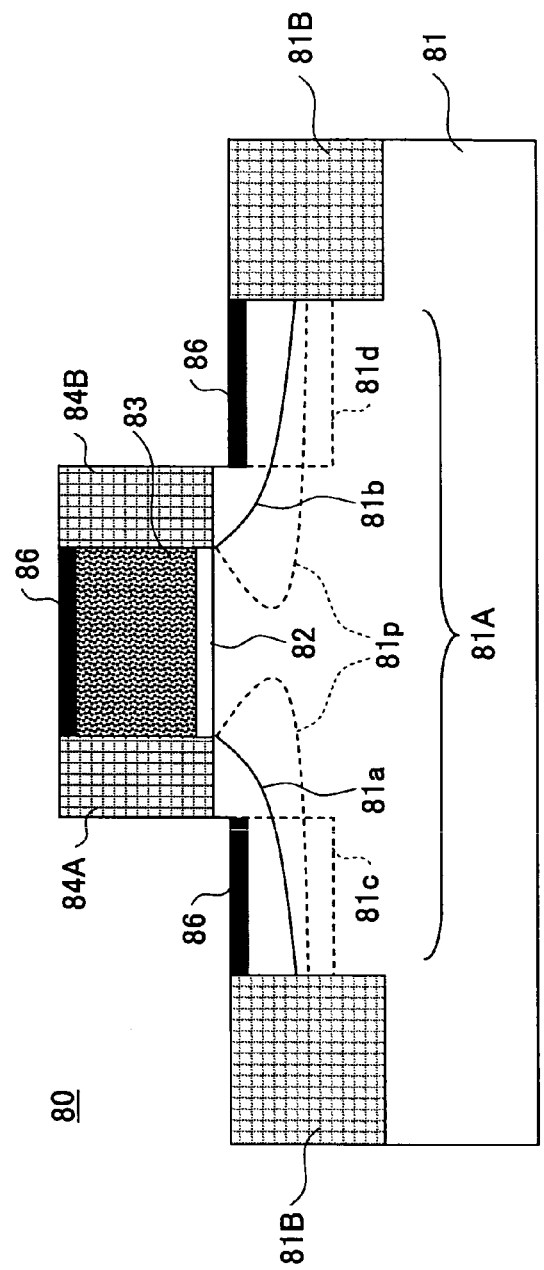
FIG.10G
FIG.10H

SEMICONDUCTOR DEVICE AND FABRICATION PROCESS THEREOF

CROSS-REFERENCE TO RELATED APPLICATION

The present application is based on Japanese priority application No. 2004-247143 filed on Aug. 26, 2004, the entire contents of which are hereby incorporated by reference.

BACKGROUND OF THE INVENTION

The present invention generally relates to fabrication of semiconductor devices and more particularly to a fabrication method of a semiconductor device having a very shallow junction.

With recent highly miniaturized, ultra-fast semiconductor devices, having a gate length of typically 90 nm or less, such as the one having the gate length of 50 nm or 40 nm, the diffusion regions constituting the source and drain regions of the transistor have a very shallow depth of about 20 nm or less.

When fabricating such a semiconductor device having a very shallow junction, particular caution has to be taken in the dry etching process that exposes the diffusion region.

With regard to the dry etching process used in the fabrication process of a MOS transistor, there can be two situations in which the dry etching process causes exposure of the diffusion regions, the first being the one used for forming a contact hole in an insulation film, and the other being the one used for forming sidewall insulation films on the sidewall surfaces of the gate electrode. In any of these processes, it is generally practiced to carry out the etching process of the insulation film by using a fluorocarbon (CF) family gas or hydrofluorocarbon (CHF) family gas for the etching gas.

At the time of the dry etching of an insulation film with an etching gas of the CF or CHF family gas, plasma is used for causing dissociation in the etching gas to form radicals or ions of active species such as F (fluorine) contained in the etching gas, and the ions of the active species thus formed are caused to react upon the substrate to be processed by accelerating the same by using a substrate bias electric field. Further, at the time of such an etching process, it is generally practiced to carry out so-called overetching, in view of possible variation of the film thickness or variation of the etching rate, in which the etching is continued for a predetermined duration after the silicon substrate surface is exposed, such that the silicon surface constituting the diffusion region is exposed completely.

On the other hand, with such an overetching process, it is generally unavoidable that the silicon surface is etched more or less as a result of the action of the etching gas to the exposed silicon surface. Particularly, the silicon surface tends to be etched by F.

In view of the situation noted above, there is an increasing tendency to use gases of high C (carbon) proportion such as $C_4F_8$ or $C_4F_6$, for the CF or CHF family etching gas, for suppressing the etching of the silicon surface and thus increasing the etching selectivity at the time of the overetching process. By using such an etching gas of high C proportion, there is caused deposition of C on the silicon surface exposed by the etching, and the undesirable etching of the silicon surface at the time of the overetching is suppressed.

(Patent Reference 1) Japanese Laid-Open Patent Application 8-78352
(Patent Reference 2) Japanese Laid-Open Patent Application 9-129602
(Non-Patent Reference 1) K. Hashimi et al., Jpn. J. Appl. Phys. vol. 35, (1996), pp. 2494

SUMMARY OF THE INVENTION

In an aspect of the present invention, there is provided a method of fabricating a semiconductor device, comprising the steps of:

modifying a damaged layer containing carbon and formed at a semiconductor surface by exposing said damaged layer to oxygen radicals to form a modified layer; and removing said modified layer by a wet etching process, said modifying step being conducted by adding to said damaged layer an active specie of an element that would obstruct formation of double bond between a Si atom and an oxygen atom by causing a chemical bond with Si atoms on said semiconductor surface.

In another aspect of the present invention, there is provided a semiconductor device, comprising:

a semiconductor substrate;

a gate electrode formed on a principal surface of said semiconductor device via a gate insulation film;

source and drain regions formed on said semiconductor substrate at respective lateral sides of said gate electrode; and stepped parts formed at respective lateral sides of sidewall insulation films formed at respective sidewall surfaces of said gate electrode, said stepped parts having a step height of 5 nm or less.

According to the present invention, it becomes possible to facilitate conversion of the damaged layer to the modified layer removable by wet etching, as compared with the case of using oxygen radicals alone, by adding, with a suitable amount, an element that would obstruct formation of double bond between a Si atom and an oxygen atom by causing preferential bonding with Si atoms on the semiconductor surface. Thereby, by conducting the modifying step such that there is caused no etching in the damaged layer, it becomes possible to avoid formation of the stepped part to have a step height beyond the initial thickness of the damaged layer, and it becomes possible to avoid formation of steps at the semiconductor surface with such a step height that would cause influence upon the operational characteristics of the semiconductor device. The present invention is particularly useful in the fabrication of ultrahigh-speed semiconductor devices fabricated by using very small ion injection energy at the time of ion implantation process of impurity elements, which is comparable with the energy of the etching gas species acting upon the substrate at the time of dry etching process.

Other objects and further features of the present invention will become apparent from the following detailed description when read in conjunction with the attached drawings.

BRIEF DESCRIPTION OF THE DRAWINGS

FIGS. 10A-10J are diagrams showing the fabrication process of a semiconductor device according to a second embodiment of the present invention;

DETAILED DESCRIPTION OF THE INVENTION

On the other hand, in the case such a CF or CHF family etching gas containing C with large proportion is used, there arises a problem in that C deposited on the silicon surface and preventing the etching of the exposed silicon surface is not simply deposited on the exposed silicon surface but is in fact impinged thereto as a result of the function of the electric field caused by the substrate biasing, and thus, there is formed a damaged layer (deteriorated layer) at the exposed surface of the silicon substrate, wherein it should be noted that the damaged layer contains SiC formed by the impinged C atoms causing a chemical bond with a Si atom on the silicon surface. Such an SiC layer has a large resistivity and causes increase of contact resistance in the metal plug formed in contact with the exposed silicon surface. Such increase of the contact resistance thus causes unwanted decrease of operational speed of the semiconductor device.

FIGS. 1A-1D show an example of formation of the damaged layer in such a contact hole.

Figure 1A:
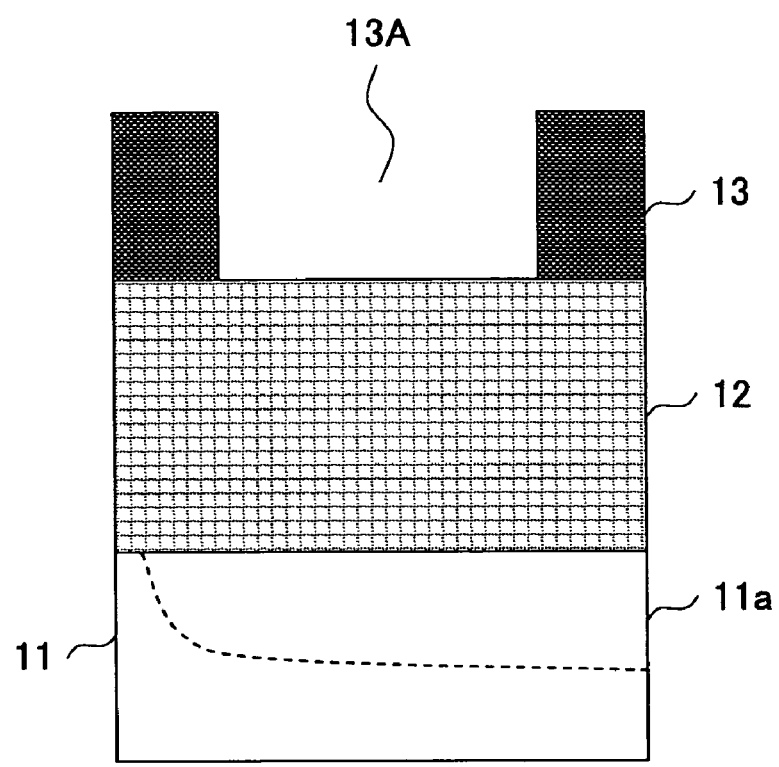
FIGS. 1A-1D are diagrams showing the formation process of a contact plug according to the related art of the present invention.

Referring to FIG. 1A, there is formed a diffusion region 11a of p-type or n-type in a silicon substrate 11, and an insulation film 12 of $SiO_2$, or the like, is formed on the surface of the silicon substrate 11.

In the step of FIG. 1A, there is formed a resist pattern 13 having an opening 13A on the insulation film 12, and the insulation film 12 is removed by a dry etching process that uses an etching gas of the CHF family, while using the resist pattern 13 as a mask. As a result, there is formed a contact hole 12A in the insulation film 12 in correspondence to the resist opening 13A.

Figure 1B:
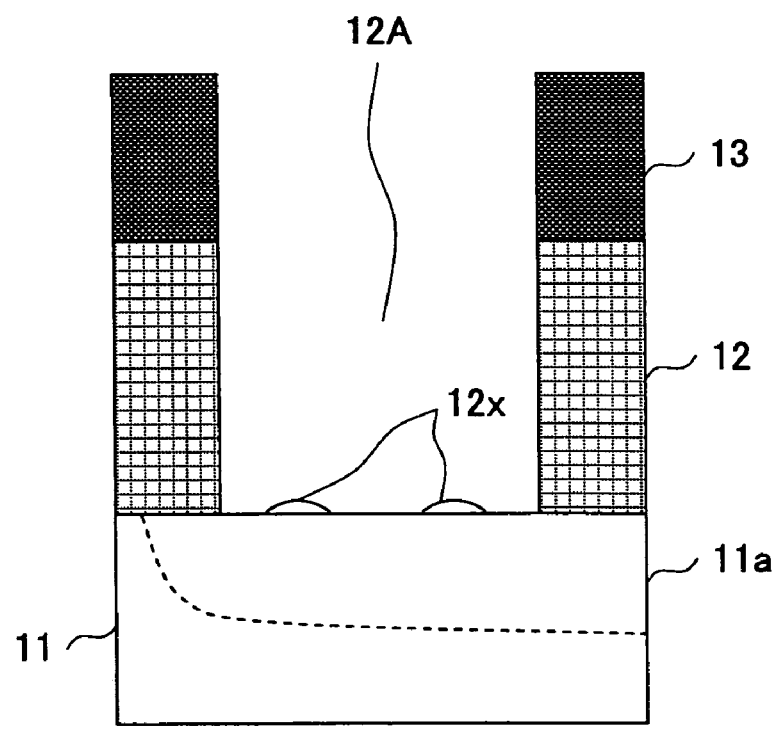

FIG. 1B shows the state in which the surface of the silicon substrate 11 is just exposed as a result of the foregoing dry etching process, wherein it will be noted that there remains a residue 12x of the insulation film 12 formed as a result of non-uniformity of the etching.

Figure 1C:
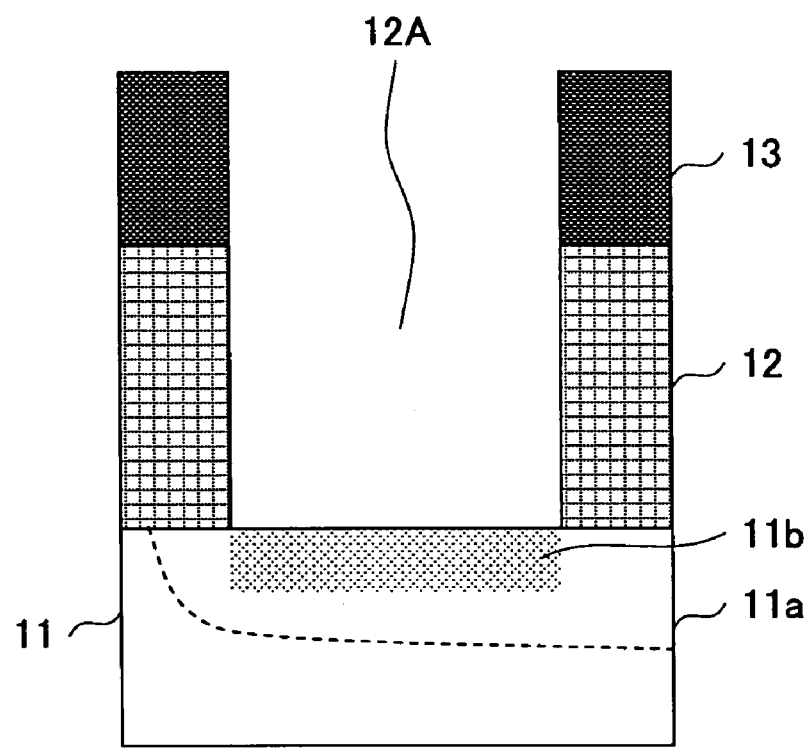

Thus, in the step of FIG. 1C, the overetching is conducted by continuing the dry etching process. With this, the residual insulation film 12x is removed completely, while such an overetching process also causes implantation of C contained in the etching gas into the silicon substrate 11. Thus, there is formed a damaged layer 11b containing C at the surface of the silicon substrate 11 in correspondence to the bottom part of the contact hole 12A. In such a damaged layer 11b containing C, it is believed that the C atoms thus implanted form SiC by causing a chemical bond with the Si atoms in the silicon substrate 11. It should be noted that formation of such a damaged layer becomes particularly conspicuous in the step of contact-hole formation of FIG. 1B when the etching gas of high C concentration such as $C_4F_8$ or $C_4F_6$ for securing etching selectivity against the silicon substrate is used.

Figure 1D:
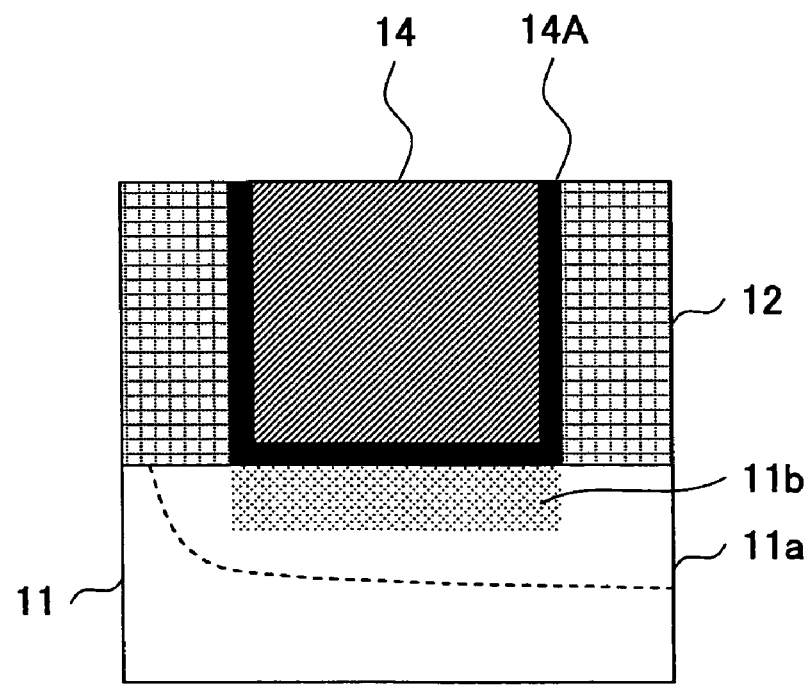

Further, in the step of FIG. 1D, the contact hole 12A is filled with a metal such as W. Further, by removing excess metal film by a chemical mechanical polishing process or the like, there is formed a contact plug 14 in contact with the diffusion region 11a via the SiC layer 11b. In the example of FIG. 1D, it will be noted that there is formed an adhesion/diffusion barrier layer 14A of Ta/TaN structure between the contact plug 14 and the silicon substrate 11 or the insulation film 12.

Figure 2:
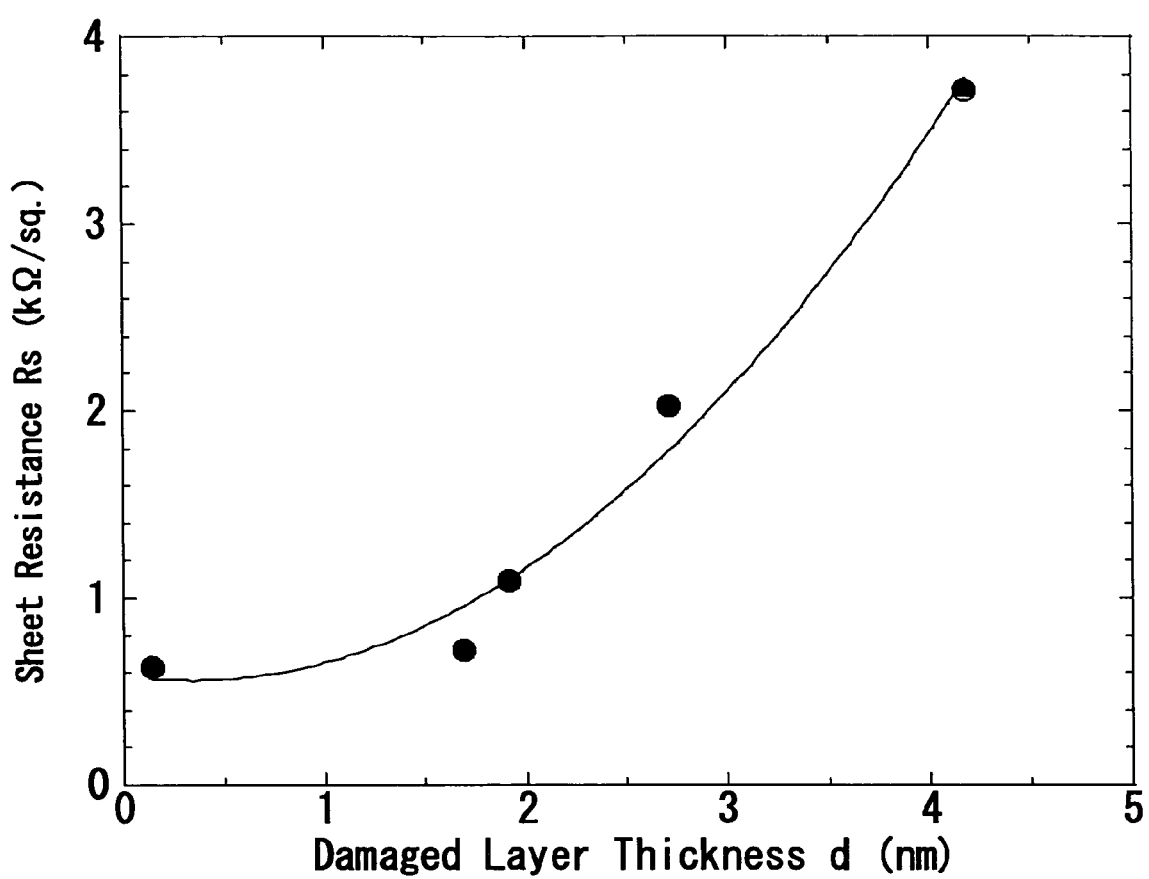
FIG. 2 is a diagram explaining the problems associated with the related art of FIG. 1.

FIG. 2 shows the change of sheet resistance of the diffusion region 11a associated with the formation of the damaged layer 11b containing SiC. In FIG. 2, it should be noted that the vertical axis represents the sheet resistance of the diffusion region 11a formed with the damaged layer 11b, while the horizontal axis represents the thickness of the damaged layer 11b.

Referring to FIG. 2, the sheet resistance, and hence the contact resistance, takes the value of about 0.6 kΩ/sq in the case there exists no such a damaged layer 11b, while in the case the damaged layer 11b is formed with the thickness of 4 nm, it can be seen that the sheet resistance increases to about 3.6 kΩ/sq.

It should be noted that formation of similar SiC layer is caused also in the case of forming the sidewall insulation films at both sidewall surfaces of the gate electrode.

FIGS. 3A-3D show the fabrication process of a semiconductor device including the formation process of such sidewall insulation films.

Figure 3A:
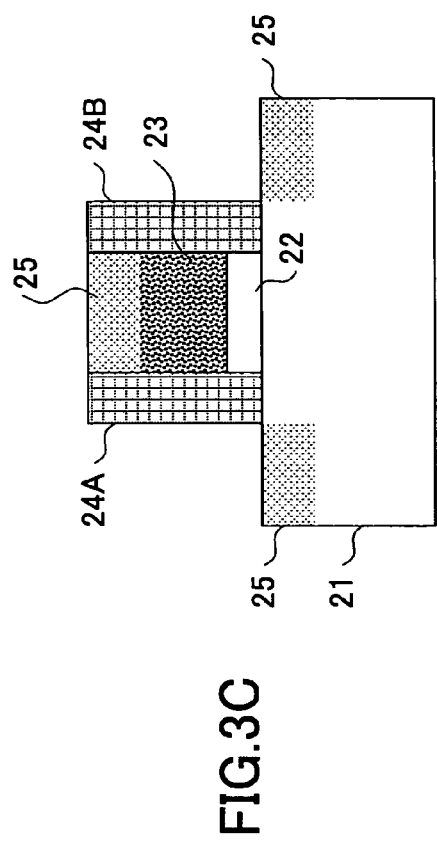
FIGS. 3A-3D are diagrams for fabricating a semiconductor device according to another related art of the present invention.

Referring to FIG. 3A, there is formed a polysilicon gate electrode 23 on a silicon substrate 21 of p-type or n-type via a gate insulation film 22, wherein there is provided an insulation film 24 of $Si_3N_4$, $SiO_2$ or SiON on the silicon substrate 21 by a CVD process, or the like, so as to cover the gate electrode 23 in conformity with the shape of the gate electrode 23.

Figure 3B:
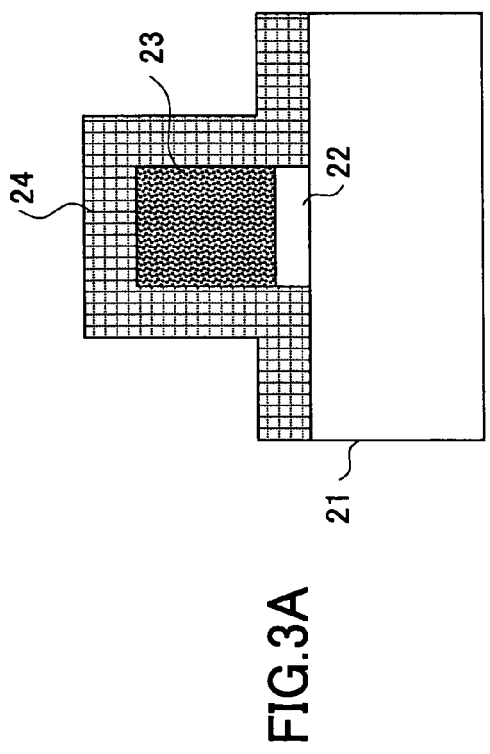

Next, in the step of FIG. 3B, an anisotropic etching process acting generally perpendicularly to the silicon substrate 21 is applied to the insulation film 24 of FIG. 3A by using an etching gas of CF family or CHF family, such that the insulation film 24 is removed from the surface of the gate electrode 23 and from the surface of the silicon substrate 21. Here, it should be noted that FIG. 3B shows the state just after the insulation film 24 has been removed from these surfaces, wherein it will be noted that there remain residues 24x of the insulation film 24 on the surface of the gate electrode 23 or on the surface of the silicon substrate 21 due to the non-uniformity of etching. Again, it should be noted that a gas of high C concentration such as $C_4F_8$ or $C_4F_6$ is used as the foregoing CF family gas or CHF family gas for securing sufficient etching selectivity between the insulation film 24 and the silicon substrate 21.

Figure 3C:
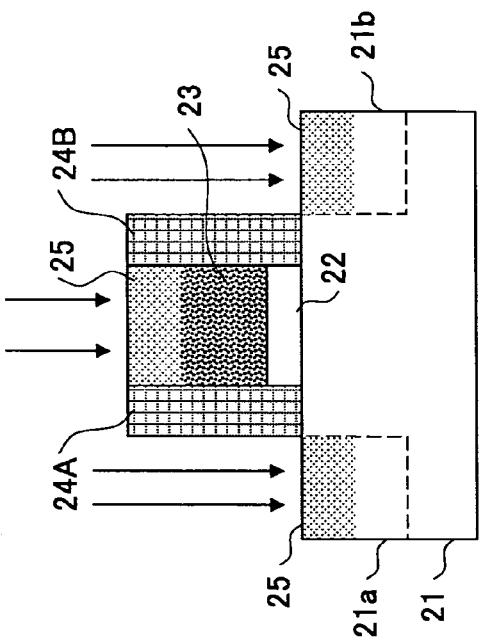

Further, in order to remove the foregoing residues 24x of FIG. 3B, an overetching is conducted in the step of FIG. 3C by continuing the dry etching process of FIG. 3B. With this overetching, on the other hand, there occurs implantation of C in the etching gas into the polysilicon gate electrode 23 and the silicon substrate 21, and as a result, there is formed a damaged layer 25 containing SiC, in which C is bonded with Si, at the surface of the polysilicon gate electrode 23 and at the exposed surface of the silicon substrate 21.

It should be noted that the damaged layer 25 thus formed not only causes increase of diffusion regions resistance and contact resistance as explained with reference to FIG. 3, but also capturing or blockade of impurity element introduced in the ion implantation process of FIG. 3D. Thereby, the impurity concentration is reduced inevitably in the gate electrode 23 or in the diffusion regions formed at both lateral sides of the gate electrode 23.

Figure 3D:
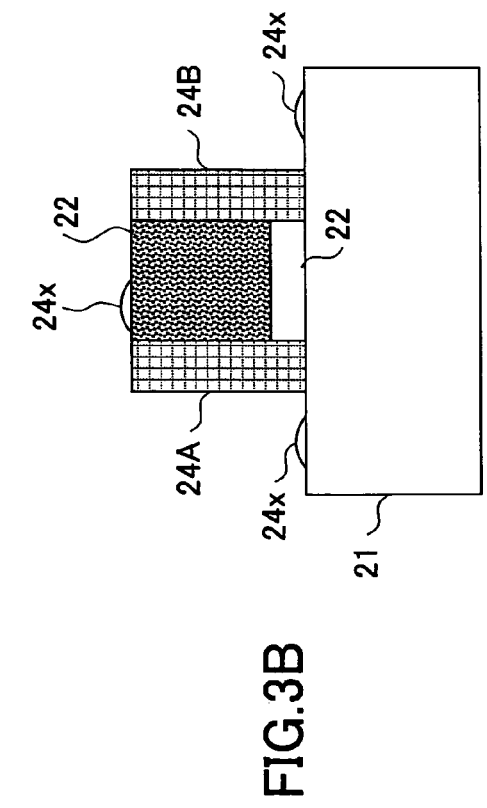

More specifically, in the step of FIG. 3D, the impurity element of n-type or p-type is introduced to the structure of FIG. 3C and the polysilicon gate electrode 23 is doped to the n-type or p-type as a result. At the same time, as a result of the ion implantation process of FIG. 3D, diffusion regions 21a and 21b of the same conductivity type are formed in the silicon substrate 21 at respective outer sides of the polysilicon gate electrode 23.

Here, it should be noted that, because of existence of the damaged layer 25 formed at the surface part of these regions, the impurity element thus injected are captured at least partly by the damaged layer 25. Thereby, the impurity element does not reach the gate electrode 23 or the diffusion regions 21a and 21b with sufficient amount, and thus, there can be caused problems in that the impurity concentration does not reach the predetermined concentration level in the gate electrode 23 and in the diffusion regions 21a and 21b.

In order to deal with this problem, Japanese Laid-Open Patent Publication 8-78352 proposes the technology of applying an $O_2$ RIE process to the damaged layer 25 and converts the same to an $SiO_2$ layer. The damaged layer thus converted to the $SiO_2$ layer is then removed by a wet etching process or the like in an HF etchant.

Figure 4C:
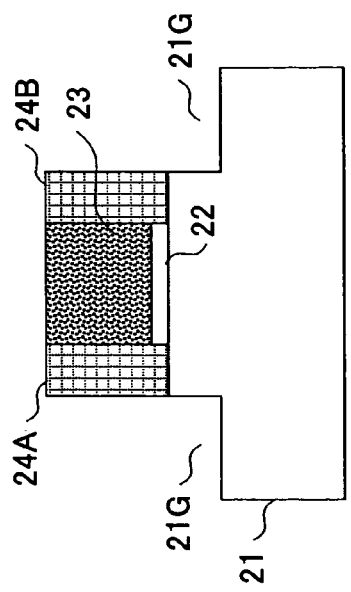
FIGS. 4A-4C are diagrams explaining further related art of the present invention.
Figure 4A:
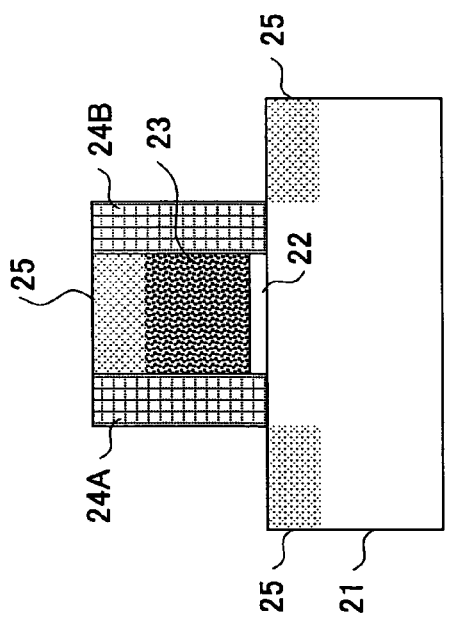
Figure 4B:
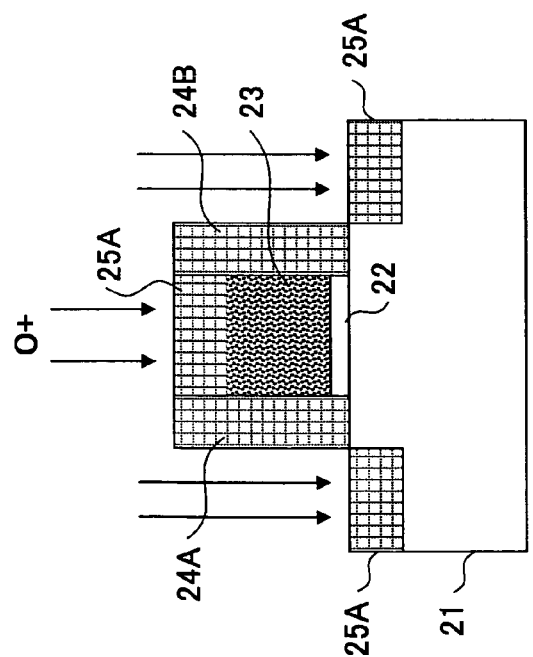

FIGS. 4A-4C show the processing according to the foregoing conventional proposal, wherein those parts corresponding to the parts described previously are designated by the same reference numerals and the description thereof will be omitted.

Referring to FIG. 4A, this state corresponds to the state of FIG. 3C, and thus, the damaged layer 25 is formed on the surface of the silicon substrate 21 and on the surface of the polysilicon gate electrode 23.

Thus, in the step of FIG. 4B, oxygen ions are injected into the structure of FIG. 4A by conducting an $O_2$ RIE processing, and the damaged layer 25 is converted to an $SiO_2$ layer 25A.

Further, by removing the $SiO_2$ layer 25A thus formed by a wet etching process in the step of FIG. 4C, the part corresponding to the damaged layer 25 is removed. Thereby, the substrate 21 is removed at the part located outside the sidewall insulation films 24A and 24B, and as a result, there is formed a stepped part 21G in correspondence to the part thus removed by the wet etching process.

Figure 5C:
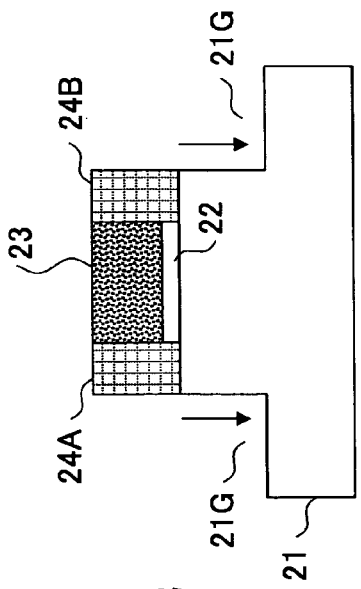
FIGS. 5A-5C are diagrams explaining the problems associated with the related art of FIGS. 4A-4D.
Figure 5A:
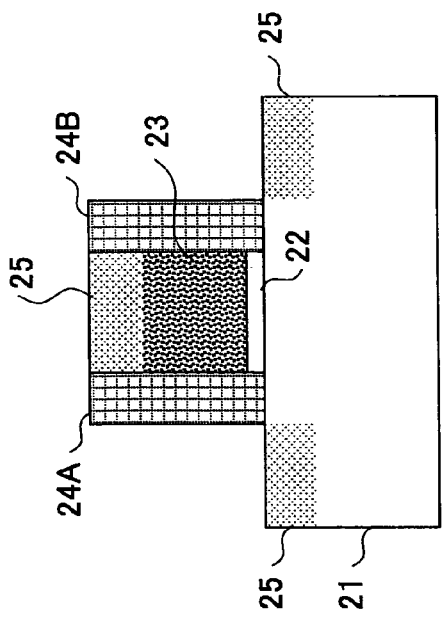
Figure 5B:
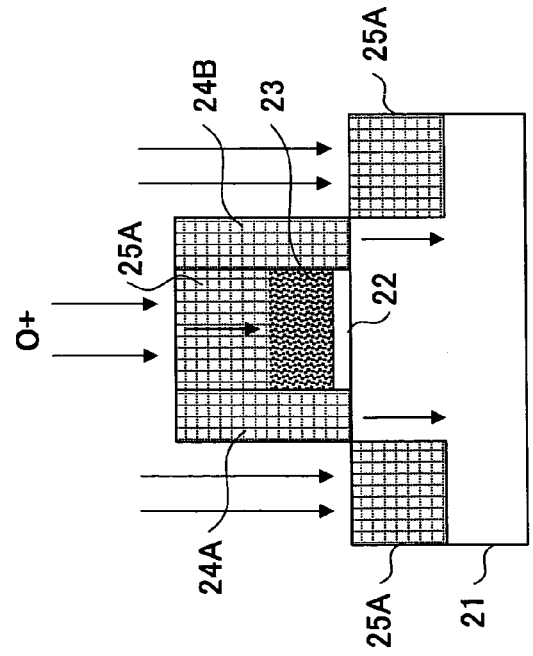

However, with such an $O_2$ RIE processing conducted under substrate biasing, it is difficult to control the injection depth of the oxygen ions, and the oxygen ions penetrate deeply into the silicon substrate 21 or into the polysilicon gate electrode 23 beyond the desired depth as indicated in FIGS. 5A-5C by arrows. Thereby, there is a substantial risk that the depth of the stepped part 21G formed in the silicon substrate 21 after the wet etching process is increased. Here, it should be noted that FIGS. 5A-5C correspond to FIGS. 4A-4C, respectively.

Figure 6:
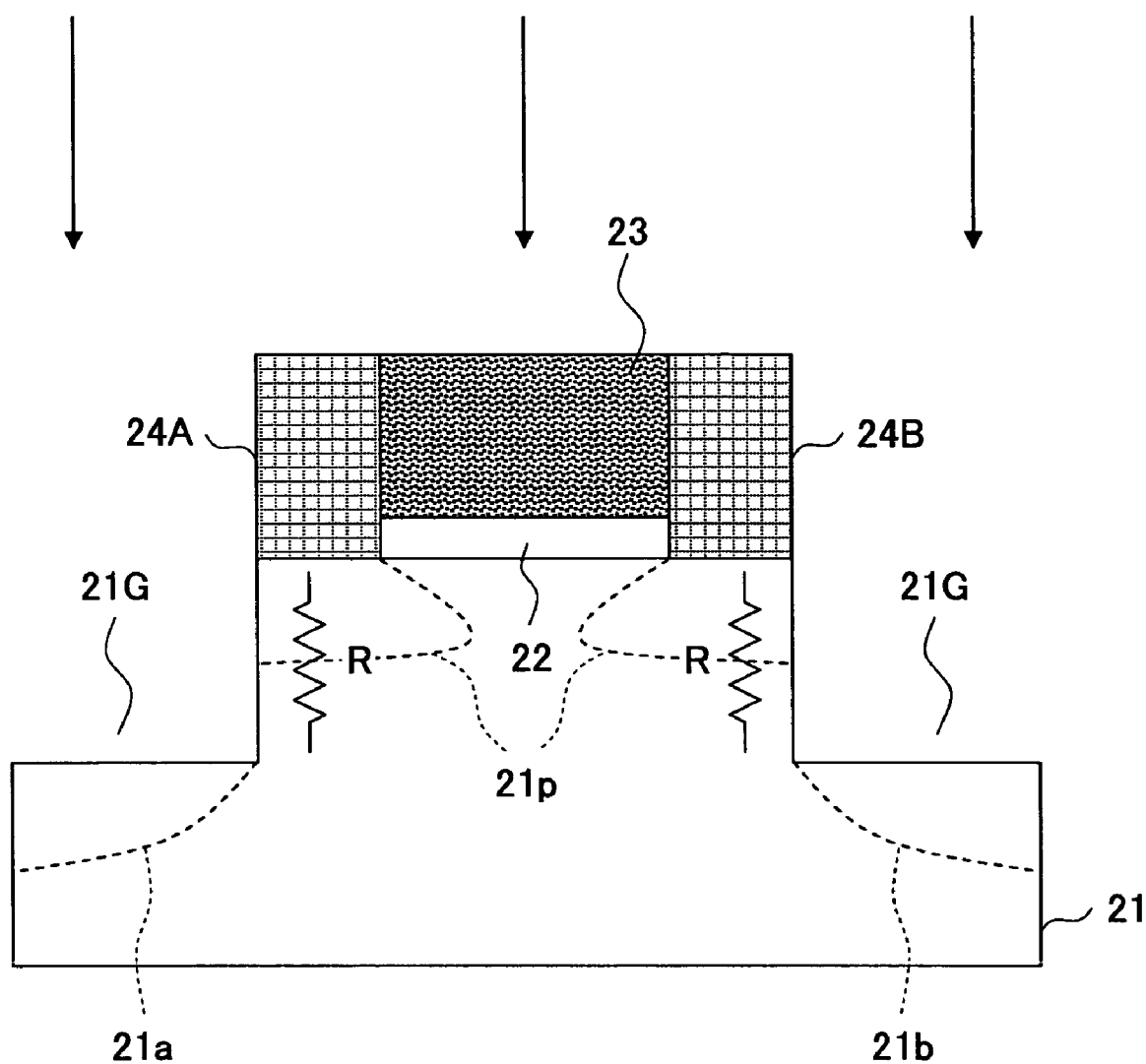
FIG. 6 is another diagram explaining the problems associated with the related art of FIGS. 4A-4D.

Thus, in the case a semiconductor device is formed by conducing ion implantation of impurity element into the structure having such a stepped part 21G, there appears a parasitic resistance R at such a stepped part 21G as represented in FIG. 6. Thereby, the operational speed of the semiconductor device is deteriorated. In FIG. 6, those parts corresponding to the parts explained previously are designated by the same reference numerals and the description thereof will be omitted. It should be noted that such a problem appears particularly conspicuously in the ultrahigh-speed semiconductor devices having a gate length of 90 nm or less.

Further, in such ultrahigh-speed semiconductor devices, it is generally practiced to form a pocket injection region 21p prior to the formation of the sidewall insulation films 24A and 24B as shown in FIG. 6 for suppressing short-channel effect by injecting an impurity element of the same conductivity type as the channel impurity element obliquely right underneath the gate electrode, while the effect of the pocket injection region 21p of suppressing the short channel effect is vanished when the amount of etching in the step of FIG. 5C is larger than the thickness of the pocket injection region 21p and the stepped part 21G goes through the pocket region 21p.

First Embodiment

Figure 7:
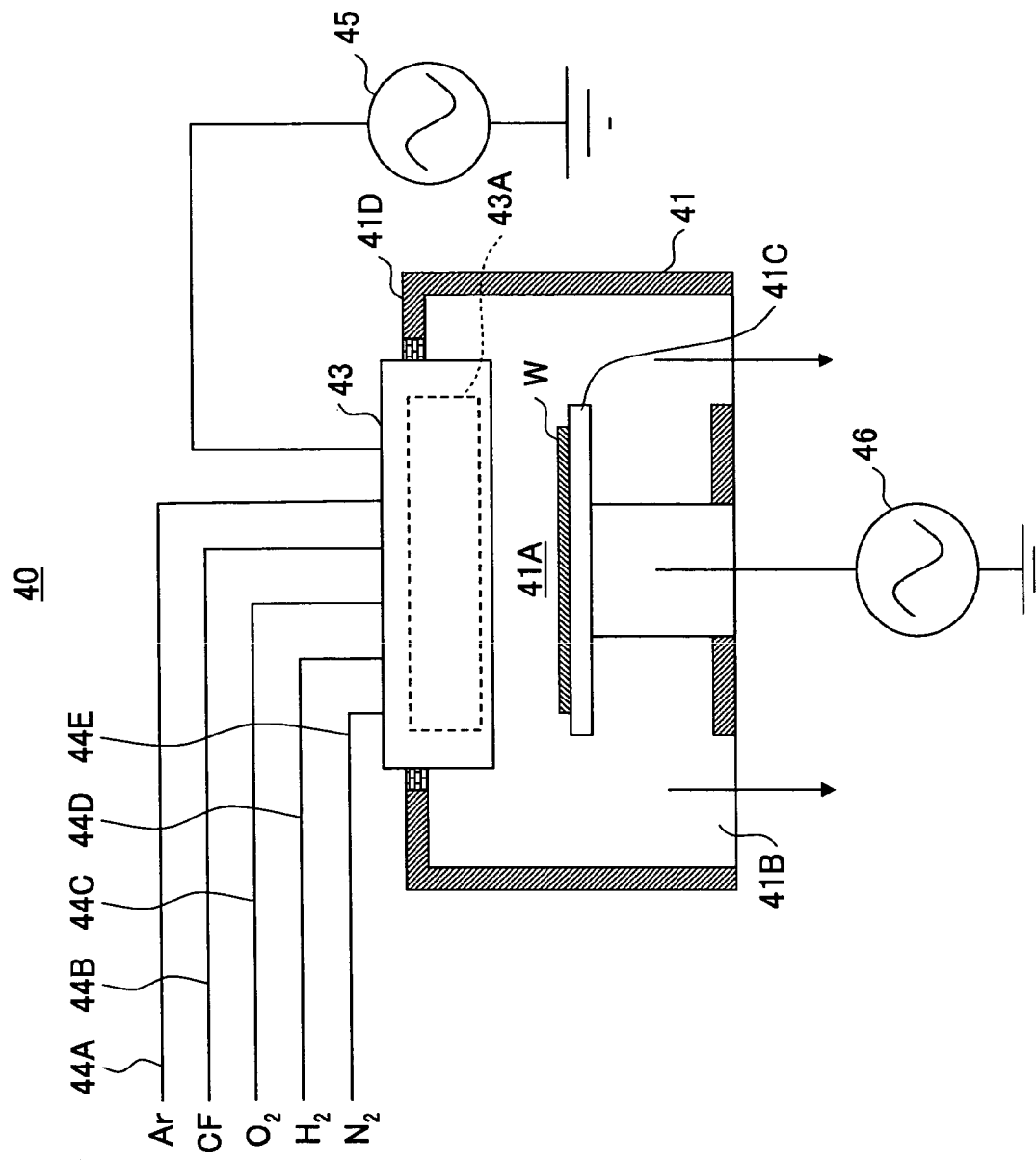
FIG. 7 is a diagram showing the construction of a plasma processing apparatus used with the present invention.

FIG. 7 shows the construction of a down-flow plasma processing apparatus 40 used with the present invention.

Referring to FIG. 7, the down-flow plasma processing apparatus 40 includes a processing vessel 41 evacuated at an evacuation port 41B and defining a processing spate 41A, wherein a stage 41C is provided in the processing vessel 41 for supporting a substrate W to be processed.

In the processing vessel 41, there is further provided a showerhead 43 so as to face the substrate W to be processed, wherein gas lines 44A, 44B, 44C, 44D and 44E are connected to the showerhead 43 respectively for supplying a rare gas such as Ar, a fluorocarbon gas such as $CF_4$, an oxygen gas, a hydrogen gas and a nitrogen gas. Further, a microwave power is supplied to the showerhead 43 from a microwave source 45, and an RF power is supplied to the stage 41C from an RF source 46. The showerhead 43 is formed of a stainless steel and holds therein a showerhead body 43A of a quartz glass.

In the investigation constituting the foundation of the present invention, the inventor of the present invention has conducted experiments of modifying a damaged layer containing SiC and formed on a silicon substrate by using the apparatus 40 of FIG. 7 and further removing the same by a wet etching process.

Figure 8A:
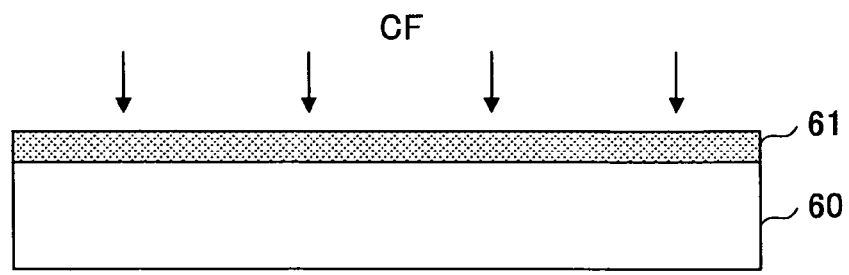
FIGS. 8A-8C are diagrams showing a substrate processing method according to a first embodiment of the present invention.
Figure 8B:
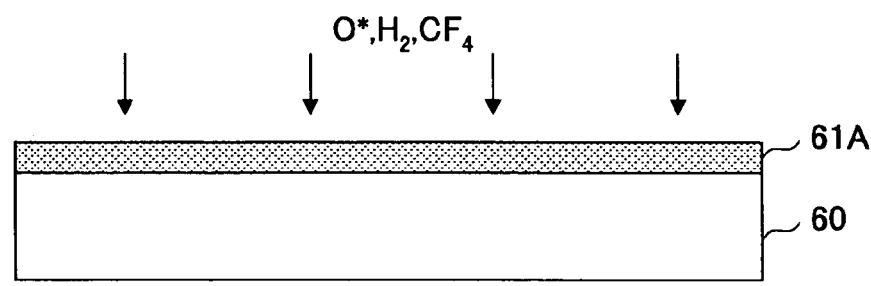
Figure 8C:
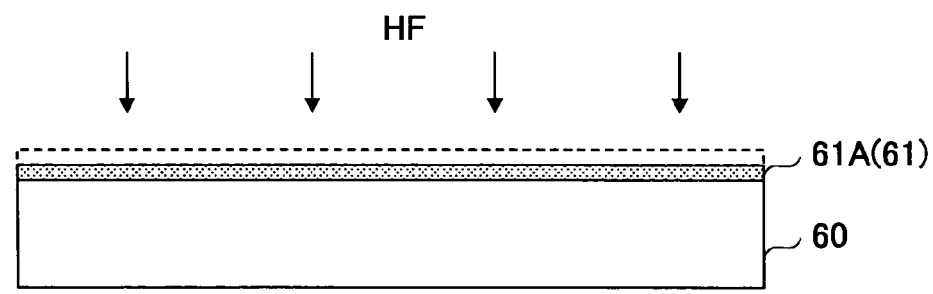

FIGS. 8A-8C explain the foregoing experiments.

Referring to FIG. 8A, a silicon substrate 60 is introduced into the processing vessel 41 of the plasma processing apparatus 40 of FIG. 7 and is placed on the stage 41C as a wafer W.

Next, the processing vessel 41 is evacuated such that the processing pressure in the processing space 41A is set to about 10 Pa.

Further, an Ar gas is introduced into the processing space 41A from the gas line 44A with a flow rate of 500 SCCM, and microwave plasma is formed in the processing space 41A by supplying a microwave power of 2.45 GHz to the showerhead 43 from the microwave source 45 with a power of 1000 W.

Further, an RF power of 200 kHz-100 MHz is supplied to the stage 41C from the RF source 46, and as a result, a D.C. bias is formed in the substrate W to be processed.

In this state, a CF gas or CHF gas having a high carbon concentration such as $C_4F_8$ is introduced into the processing space 41A from the gas line 44B, and a process corresponding to the overetching process of FIG. 1C is applied to the surface of the silicon substrate 60. With this, a damaged layer 61 containing SiC is formed on the surface of the silicon substrate 60 with the thickness of 5 nm.

Next, in the step of FIG. 8B, the RF source 46 is deenergized and the processing space 41A is purged with an Ar gas from the line 44A. Further, while maintaining the processing space 41A to the processing pressure of 500 Pa, a modifying step of the damaged layer 61 is conducted by supplying the Ar gas from the gas line 44A, the CF$_4$ gas from the gas line 44B, the oxygen gas from the gas line 44C, the hydrogen gas from the gas line 44D and the nitrogen gas from the gas line 44E into the processing space 41A.

In the step of FIG. 8B, it should be noted that no substrate bias is applied to the substrate W to be processed. Thus, there occurs no acceleration of ions in the plasma by the biasing electric field applied to the substrate W to be processed, and thus, there occurs no collision of accelerated ions with the substrate W in the step of FIG. 8B.

Thereby, the damaged layer 61 at the surface of the substrate 60 is exposed to the oxygen radicals O* formed from the oxygen gas, hydrogen radicals H* formed from the hydrogen gas, fluorine radicals F* formed from the CF$_4$ gas and the nitrogen radicals N* formed from the nitrogen gas, and as a result, the damaged layer 61 undergoes a chemical modification process, causing a conversion of the same partly or totally to a modified layer 61A primarily formed of SiO$_2$.

Further, in the step of FIG. 8C, the silicon substrate 60 having the modified layer 61A is subjected to a wet etching process of HF, and the modified layer 61A is removed selectively with regard to the silicon substrate 60. In the example of FIG. 8C, it can be seen that there remains a damaged layer 61 not modified on the silicon substrate 60.

Figure 9:
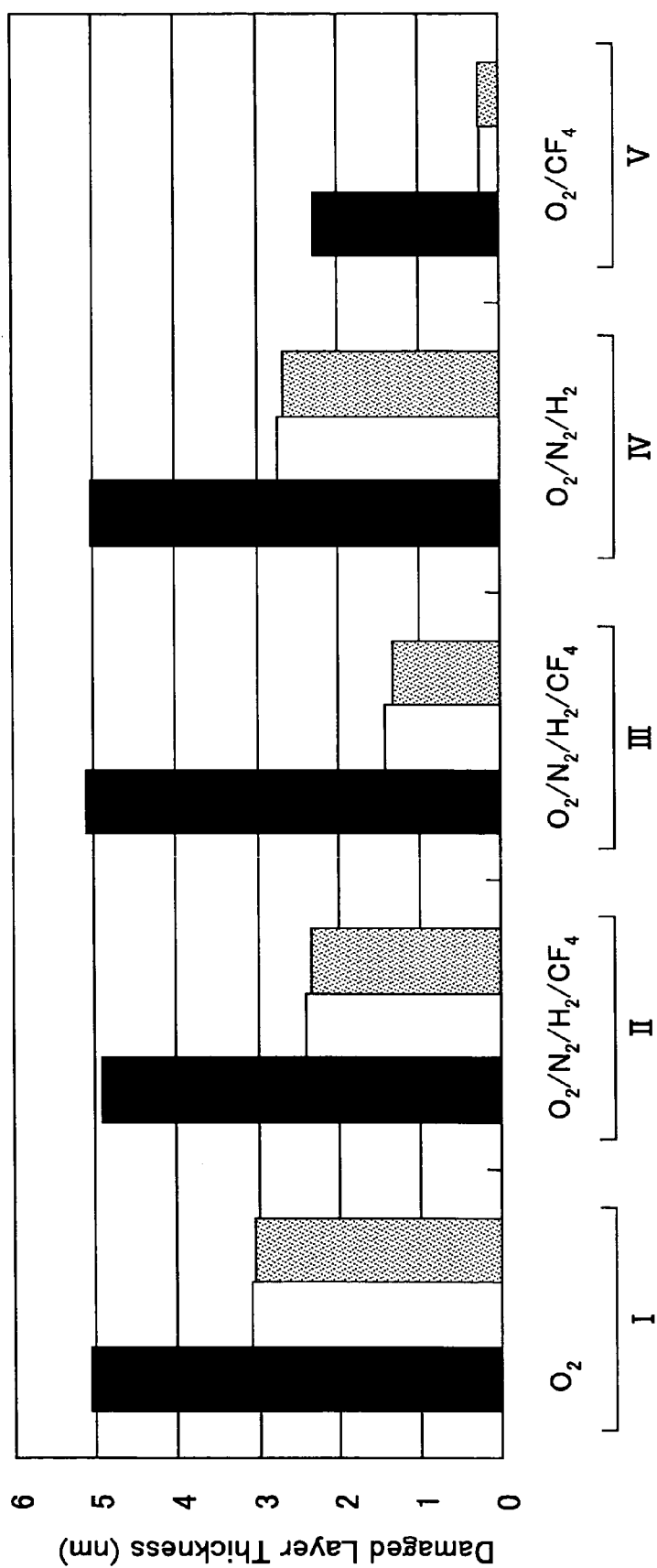
FIG. 9 is a diagram showing the evaluation of the substrate processing method of FIGS. 8A-8C.

FIG. 9 shows the thickness of the modified layer 61A for various combinations of the gases supplied in the step of FIG. 8B, together with the thickness of the modification layer 61A for the state in which the wet etching step of FIG. 8C is conducted. In FIG. 9, the vertical axis represents the thickness of the modified layer 61A on the silicon substrate 60, while the horizontal axis represents the combination of the gases. In FIG. 9, the black graph represents the thickness of the modified layer 61A in the state of FIG. 8B, while the white graph represents the thickness of the modified layer 61A in the state of FIG. 8C. Further, the grey graph represents the thickness of the modified layer 61A in the case the duration of the wet etching process is increased further in the step of FIG. 8C.

In FIG. 9, it should be noted that the experiment (I) represents the result in which the modifying step of FIG. 8B is conducted by solely supplying the oxygen gas of the gas line 44C with the flow rate of 1000 SCCM, while the experiment (II) represents the result in which the modifying step of FIG. 8B is conducted by supplying, in addition to the oxygen gas from the gas line 44C with the flow rate of 1000 SCCM, the CF$_4$ gas in the gas line 44B with the flow rate of 10 SCCM, the hydrogen gas in the gas line 44D with the flow rate of 10 SCCM, and the nitrogen gas in the gas line 44E with the flow rate of 500 SCCM. Further, the experiment (III) represents the result for the case in which the modifying step of FIG. 8B is conducted by supplying, in addition to the oxygen gas from the gas line 44C with the flow rate of 1000 SCCM, the CF$_4$ gas in the gas line 44B with a larger flow rate of 50 SCCM, the hydrogen gas in the gas line 44D with the flow rate of 10 SCCM and the nitrogen gas in the gas line 44E with the flow rate of 500 SCCM, while the experiment (IV) represents the result for the case in which the modifying step of FIG. 8B is conducted by supplying, in addition to the oxygen gas from the gas line 44C with the flow rate of 1000 SCCM, the hydrogen gas in the gas line 44D with the flow rate of 10 SCCM, the nitrogen gas in the gas line 44E with the flow rate of 500 SCCM. Contrary to this the experiment (V) of FIG. 9 represents the result in which the modifying step of FIG. 8B is conducted by supplying, in addition to the oxygen gas from the gas line 44C with the flow rate of 1000 SCCM, the CF$_4$ gas in the gas line 44B with the flow rate of 10 SCCM such that the ratio of the oxygen gas and the CF$_4$ gas becomes 100:1.

In all the experiments, it should be noted that the foregoing modifying step is conducted under the processing pressure of 500 Pa while supplying the microwave power of 1000 W to the showerhead 43. Further, as noted before, no substrate bias is applied in the modifying step of FIG. 8B.

Referring to FIG. 9, it can be seen that the thickness of the damaged layer 61 has not changed from the initial thickness of 5 nm in the experiments (I)-(IV) even when the modifying step of FIG. 8B is conducted, indicating that there has been caused no thickness loss in the modifying step of FIG. 8B. Contrary to this, in the experiment (V), it can be seen that the initial thickness of 5 nm has been decreased to about 2 nm as a result of the modifying step, indicating that there has been caused a loss of Si at the silicon surface as a result of the modifying step and that there can occur encroachment of the silicon surface when the processing condition of the modifying step is inappropriate.

In the experiment (I), on the other hand, it can be seen that the modified layer 61A remains after the wet etching process of FIG. 8C is conducted after the modifying step of FIG. 8B with the thickness of about 3 nm, while this indicates that the modifying reaction has not proceeded sufficiently and the damaged layer 61 of FIG. 8A has been left with the thickness of about 3 nm.

In the experiment (II), on the other hand, it will be noted that the thickness of the modified layer 61A remaining on the silicon substrate 60 after the wet etching process has been decreased further by adding the nitrogen gas and the hydrogen gas and the CF4 gas to the oxygen gas, indicating that the modifying reaction has proceeded more effectively. Further, as can be seen in experiment (III), the efficiency of the modifying reaction is improved by increasing the proportion of the CF$_4$ gas. In the experiment (II), it should be noted that the oxygen gas, nitrogen gas, hydrogen gas and the CF$_4$ gas are used with the ratio of 100:50:1:1 (100:1 ratio for the oxygen gas an the CF$_4$ gas), while in the experiment (III), the oxygen gas, the nitrogen gas, the hydrogen gas and the CF$_4$ gas are used with the ratio of 100:50:1:5 (20:1 ratio for the oxygen gas and the CF$_4$ gas).

Further, as shown in the experiment (IV), it will be noted that the efficiency of the modifying reaction is improved as compared with the case of the experiment (I) by merely adding the nitrogen gas and the hydrogen gas to the oxygen gas.

When such a further gas such as the hydrogen gas or the CF family gas is added to the oxygen radicals, there are formed hydrogen radicals or F radicals in the processing space 41A as a result of the plasma excitation of these added gases, while it is believed that these radicals replace the C atoms in the damaged layer 61 of FIG. 8A promptly and the damaged layer 61 is converted to the HF-soluble film of SiOH or SiOF. Thus, by adding the hydrogen radicals or F radicals having high reactivity with Si and thus obstructing formation of double bond between the Si atoms and the oxygen atoms to the oxygen radicals with a suitable amount in the modifying step of FIG. 8B, formation of stable SiO$_2$ film at the surface of the damaged layer 61 preventing further modification of the interior of the damaged layer 61 is suppressed, and the modification region of FIG. 8B penetrates deeply into the damaged layer 61.

Particularly, as can be seen in the experiment (III), the modifying reaction proceeds deeply into the interior of the film by increasing the proportion of the F radicals, and it is thought preferable to increase the amount of the CF gas added in the step of FIG. 8B. On the other hand, it is also indicated from the experiment (V) that excessive F radicals can cause etching of the silicon substrate in the modifying step of FIG.

8B. In this case, there can be caused unwanted formation of stepped part explained previously.

Second Embodiment

FIGS. 10A-10J are diagrams showing the fabrication process of a semiconductor device 80 according to a second embodiment of the present invention for the case of fabricating a p-channel MOS transistor.

Figure 10A:
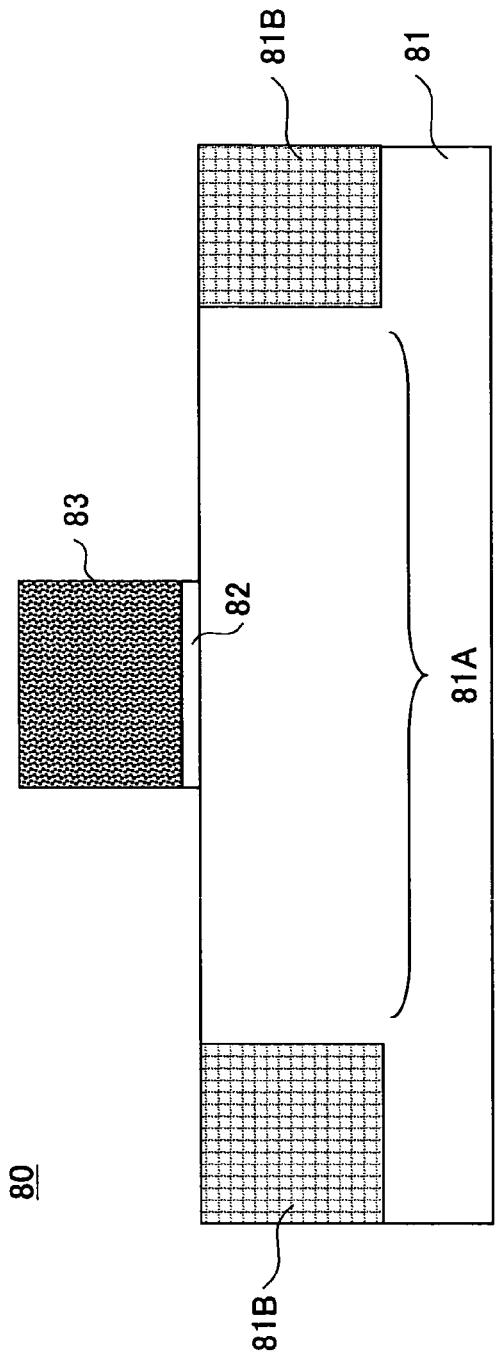

Referring to FIG. 10A, the semiconductor device 80 is formed on an n-type device region 81 defined on a silicon substrate 81 by an STI device isolation structure 81B, wherein, in the state of FIG. 10A, there is formed a polysilicon gate electrode 83 having a gate length of 90 nm or less such as the one having the gate length of 40 nm on the device region 81A via an SiON gate insulation film 82 having the thickness of 1 nm.

Figure 10B:
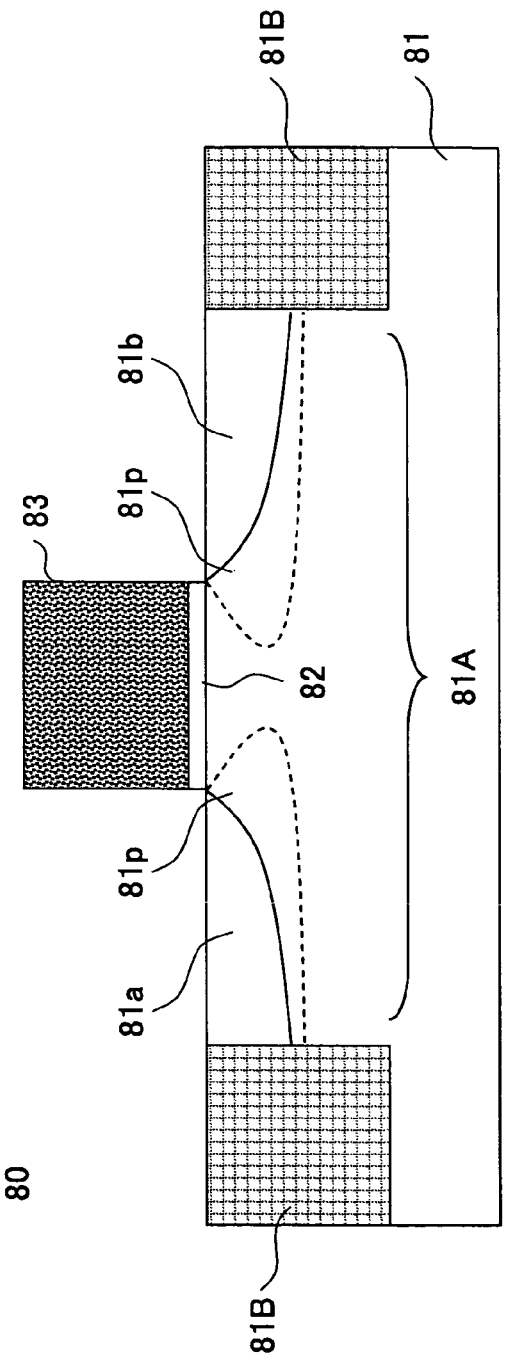

Next, in the step of FIG. 10B, P+ (or As+ or Sb+) is introduced into the silicon substrate with an oblique ion implantation process conducted under the acceleration voltage of 30 keV with a dose of $1\times10^{13}$ cm$^{-2}$ while using the polysilicon gate electrode 83 as a mask, and as a result, there are formed n-type pocket injection regions 81p at both lateral sides of the gate electrode 83, such that the respective tip end parts of the pocket injection regions 81p invade under the channel region right underneath the gate electrode 83.

Further, in the step of FIG. 10B, B+ is introduced under the acceleration voltage of 1 keV with the dose of about $1\times10^{15}$ cm$^{-2}$ while using the polysilicon gate electrode 83 as a mask, and there are formed a source extension region 81a and a drain extension region 81b of p-type at both lateral sides of the gate electrode 83.

Further, in the step of FIG. 10C, a silicon oxide film 84 is deposited on the structure of FIG. 10B by a CVD process so as to cover the surface of the silicon substrate 81 and the gate electrode 83, and the silicon oxide film 84 thus deposited is etched back in the step of FIG. 10D by a dry etching process that uses a CF family gas or CHF family gas such as $C_4F_8$. With this, sidewall insulation films 84A and 84B are formed on the respective sidewall surfaces of the polysilicon gate electrode 83. This etch back process of FIG. 10C may be conducted by using the plasma processing apparatus such as the down-flow plasma processing apparatus of FIG. 7 while applying a substrate bias to the substrate W to be processed.

As a result of such a plasma etching process, there are exposed the surface of the silicon substrate 81 at the respective outer sides of the sidewall insulation films 84A and 84B and also the surface of the polysilicon gate electrode 83. Thereby, carbon in the etching gas is injected to the exposed silicon surface as a result of the substrate bias electric field, and there is formed a damaged layer 85 containing SiC on such a surface with the thickness of several nanometers.

Thus, in the present embodiment, there is conducted a modifying process that modifies the damaged layer 85 primarily formed of SiC to a modified layer 85A formed primarily of $SiO_2$ soluble to HF and containing further SiOF or SiOH by using the down-flow plasma processing apparatus 40 of FIG. 7 and by supplying a nitrogen gas, a hydrogen gas and a CF or CHF gas to the processing space 41A in addition to the oxygen gas, without applying the substrate bias. It should be noted that this modifying process can be conducted by the condition similar to the one used with the experiments (II)-(IV) in the modifying process of FIG. 8B explained previously.

Next, in the step of FIG. 10F, the structure of FIG. 10E is subjected to a wet etching process in HF and the modified layer 85A is removed.

In the step of FIG. 10F, there is formed a stepped part 81G on the surface of the silicon substrate 81 with the wet etching of the modifying layer 85A, while in the present embodiment, the modified layer 85 is not etched during the modifying step of FIG. 10E, and thus, the height of the stepped part 81G never exceeds the initial thickness of the damaged layer 85. In the example of FIG. 10F, it will be noted that there remains a small amount of unreacted damaged layer 85 after the wet etching process by HF as the residual modified layer 85A.

Thereby, it should be noted that the thickness of the residual modified layer 85A can be minimized or made zero by optimizing the modifying process of FIG. 10E. Thus, it becomes possible to make the thickness of the residual modified layer 85A after the wet etching process of FIG. 10F to almost zero without etching the modified layer 85. In this case, there occurs no etching of the silicon surface underneath the residual modified layer 85A.

Next, in the step of FIG. 10G, there is conducted an ion implantation process of B+ into the silicon substrate 81 under the acceleration electrode of 0.5 keV or less with a high dose of $5.0\times10^{15}$ cm$^{-2}$ while using the gate electrode 85 and the sidewall insulation films 84A and 84B as a mask. Thereby, source and drain diffusion regions 81c and 81d are formed at respective outer sides of the sidewall insulation films 84A and 84B such that the source diffusion region 81c partially overlaps with the source extension region 81 and the drain diffusion region 81d partially overlaps the drain extension region 81b. At the same time, the polysilicon gate electrode 83 is doped by B+ to a high concentration level.

In the step of FIG. 10G, in which the damaged layer 85, formed at the exposed part of the silicon substrate 81 and thus at the source diffusion region 81c and the drain diffusion region 81d and further at the exposed part of the gate electrode 83, is removed or partially removed as a result of the wet etching process of FIG. 10F after the modifying step of FIG. 10E, the ion implantation process of FIG. 10G is conducted efficiently and effectively without the problem of the injected impurity element being captured by the modified layer 85. Thus, with the present invention, the source and drain diffusion regions 81c and 81d are doped with high concentration and the source resistance of the semiconductor device is reduced successfully. Further, the gate electrode 83 is doped to a high concentration level, and the problem of gate depletion, which tends to occur with such ultrahigh-speed semiconductor devices, can be suppressed effectively.

Figure 10I:
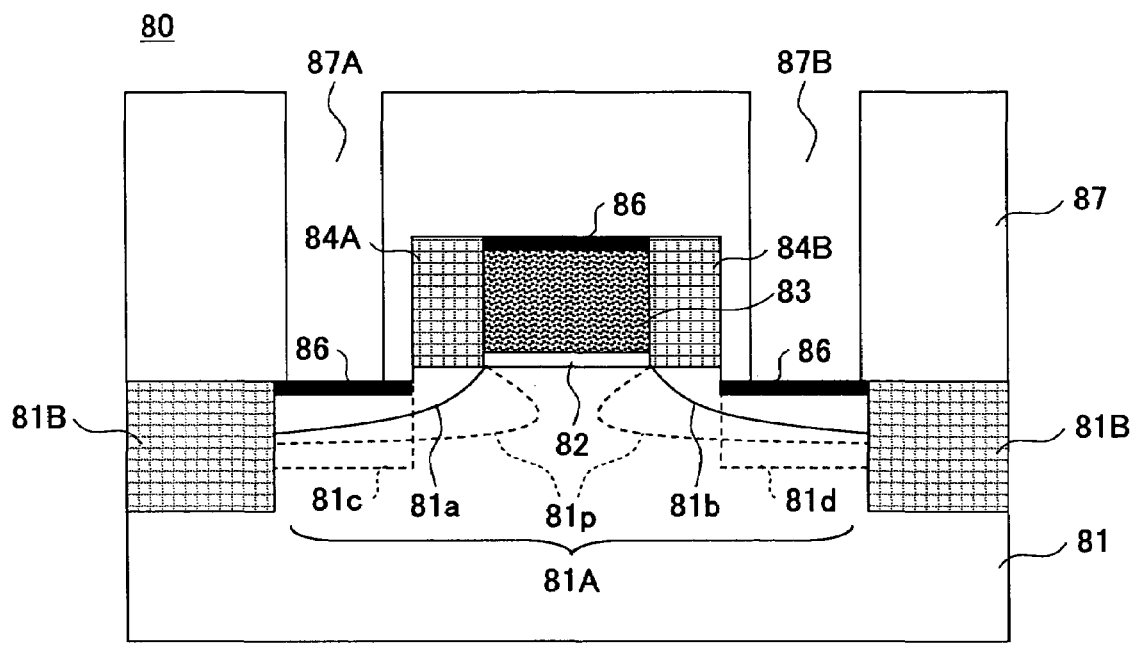

Further, in the step of FIG. 10H, there is formed a silicide layer 86 of cobalt silicide or nickel silicide at the surface of the diffusion regions 81c and 81d and further at the surface of the polysilicon gate electrode 83 by a salicide process, and an interlayer insulation film 87 is deposited on the structure of FIG. 10H in the step of FIG. 10I. Thereby, there are formed contact holes 87A and 87B in the interlayer insulation film 87 respectively in correspondence to the diffusion regions 81c and 81d in the step of FIG. 10I so as to expose the respective silicide layers 86.

Figure 10J:
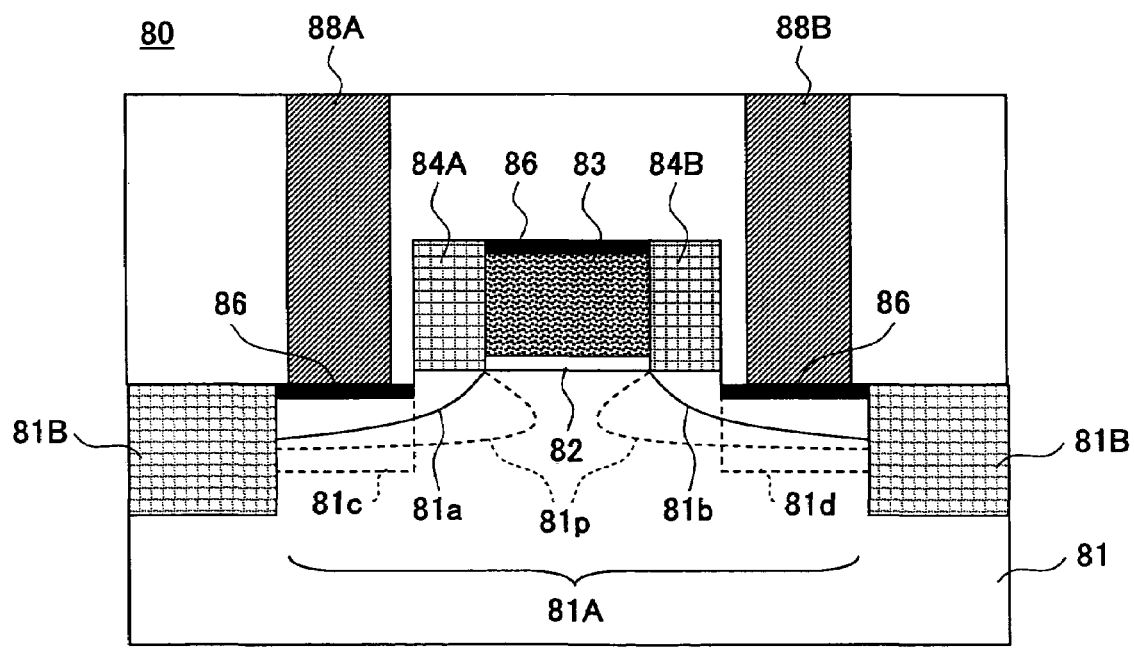

Finally, in the step of FIG. 10J, the contact holes 87A and 87B are filled with conductive plugs 88A and 88B.

It should be noted that the MOS transistor thus fabricated has advantageous features, in addition to the feature that the source and drain diffusion regions 81a and 81b and the polysilicon gate electrode 83 are doped to high concentration level, in that the stepped part formed as a result of the wet etching process of FIG. 10F has a small step height. Thus, there occurs no problem such as the bottom of the stepped part 81G comes close to the bottom edge of the pocket injection region 81p or the bottom edge of the source and drain extension regions 81a and 81b, or goes through the same. Thereby, the problems such as variation of threshold characteristics with decrease of the gate length or increase of the leakage current are suppressed. Further, in the silicide formation step of FIG. 10H, too, the thickness of the damaged layer 85 formed at the surface on which the silicide layer 86 is formed, is decreased, and thus, the defects in the silicide layer 86 is reduced.

Further, while not illustrated, a similar process can be used also for fabricating an n-channel MOS transistor.

Figure 11:
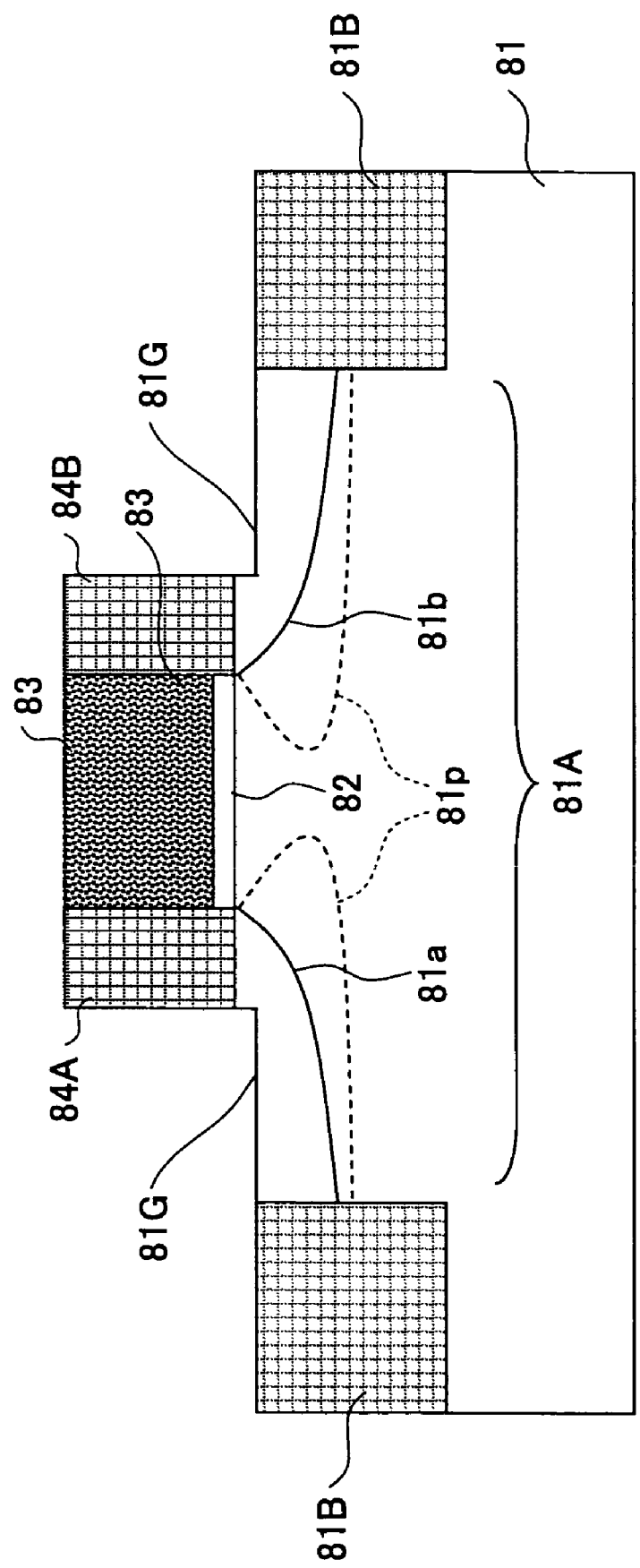
FIG. 11 is a diagram showing a modification of the second embodiment of the present invention.

Ideally, the damaged layer 85 is converted to the modified layer 85A for the entire thickness in the step of FIG. 10E and is removed entirely with the step of FIG. 10F, as represented in FIG. 11. It should be noted that FIG. 11 corresponds to FIG. 10F and further explanation thereof will be omitted.

While the foregoing explanation was made for the case of using the down-flow plasma processing apparatus 40 of FIG. 7 for the plasma processing apparatus in the modifying process of FIG. 10E, the present invention is by no means limited to such a specific plasma processing apparatus of specific type, and it is also possible to use other plasma processing apparatuses including the apparatus of parallel plate type, ECR type, ICP type, toroidal type, and the like.

Figure 12:
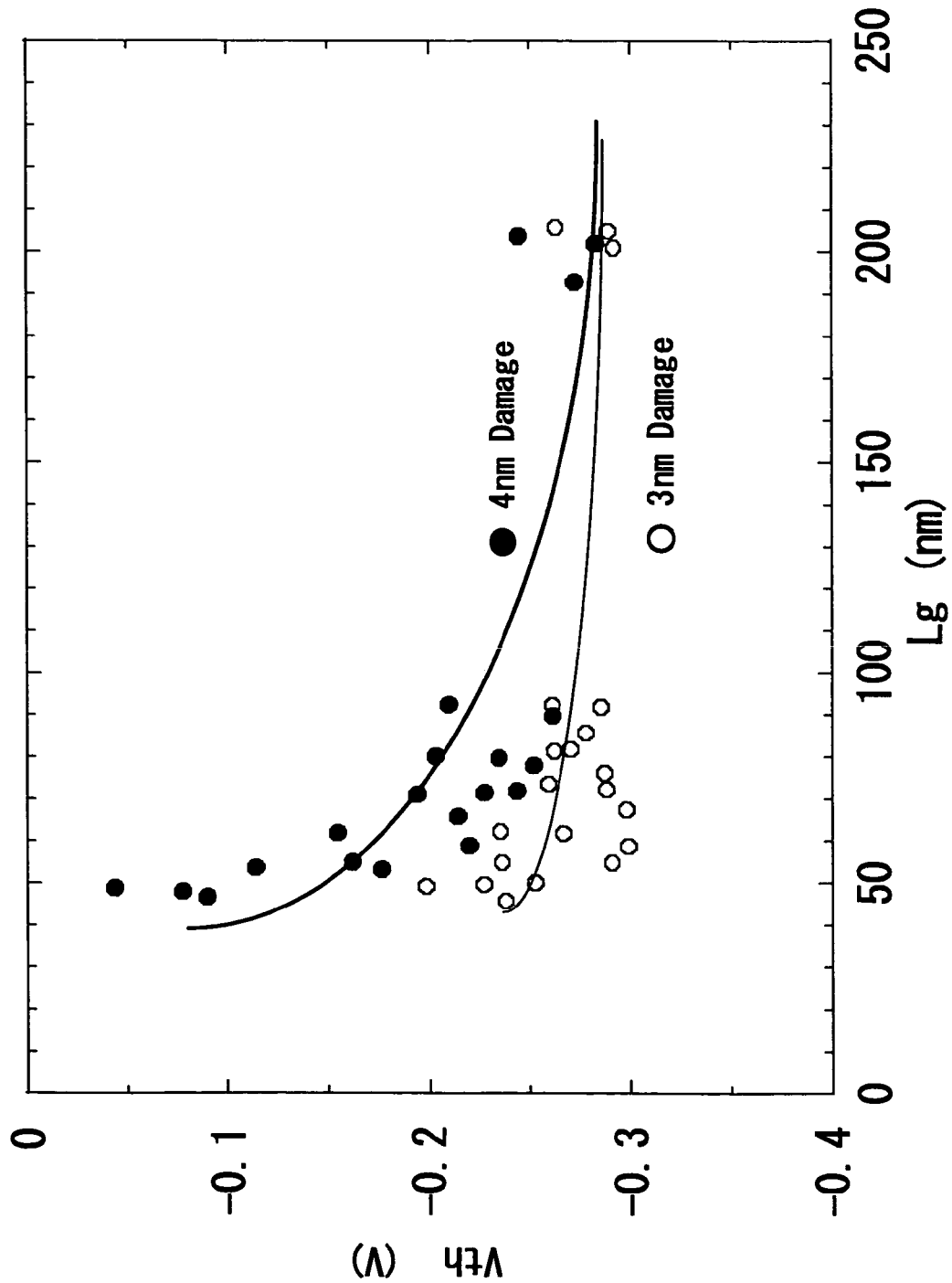
FIG. 12 is a diagram showing the characteristics of the semiconductor device according to a second embodiment of the present invention.

FIG. 12 shows the relationship between the threshold value Vth and the gate length Lg of a p-channel MOS transistor for the case in which the stepped part 81G formed in the wet etching process of FIG. 10F has come to the depth of about 3 nm under the damaged layer 85 (represented by open circles) and the case in which the stepped part 81G has reached the depth of about 4 nm under the damaged layer 85 (represented by solid circles).

Referring to FIG. 12, it can be seen that the variation of the threshold value is very small in the case the stepped part 81G at the silicon substrate surface is about 3 nm as long as the gate length is within the range of 50-90 nm. On the other hand, in the case the stepped part 81G at the silicon substrate surface is about 4 nm, it can be seen that the variation of the threshold value increases sharply when the gate length Lg has become smaller than about 70 nm. This indicates that, with such increase of depth of the stepped part 81G, the surface of the silicon substrate 81 comes close to the bottom edge of the pocket injection region 81p and the function of the pocket injection region 81p of suppressing the short channel effect is no longer working effectively.

Figure 13:
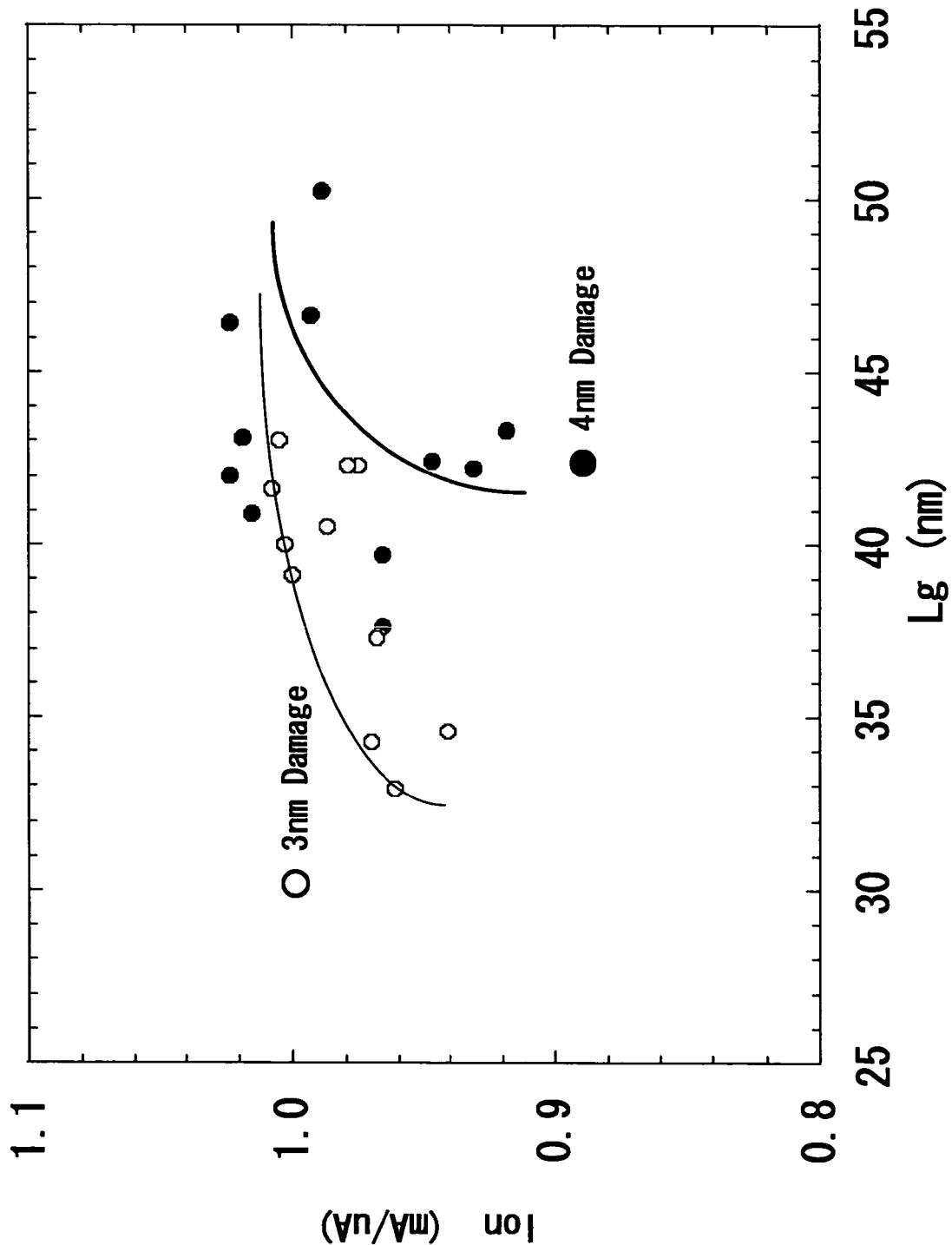
FIG. 13 is another diagram showing the characteristics of the semiconductor device of the second embodiment.

FIG. 13 shows the relationship between the on-current Ion and the gate length Lg for the MOS transistor obtained with the present invention, wherein FIG. 13 shows the results for an n-channel MOS transistor. In FIG. 13, the open circles represent the result for the specimen in which the stepped part 81G has reached the depth of about 3 nm underneath the damaged layer 85, while the solid circles represent the result for the case in which the stepped part 81G has reached the depth of about 4 nm under the damaged layer 85.

Referring to FIG. 13, in the case the encroachment (Si loss) underneath the damaged layer 85 is small, it can be seen that the decrease of the on-current with decrease of the gate length is relatively small, while in the case there is a large Si loss, there occurs a remarkable decrease in the on-current. In any of these cases, there can be seen no change of sheet resistance. Thus, it is believed that the result of FIG. 13 reflects the increase of parasitic resistance caused with increase in the step height of the stepped part 81G.

Contrary to this, with the present embodiment, the etching does not proceed beyond the bottom edge of the damaged layer 85 in the wet etching process of FIG. 10F, and thus, there is caused no excessive Si loss. Thereby, the short channel effect is suppressed minimum, and it becomes possible to secure stable threshold characteristics and sufficient on-current value even in the case the gate length is reduced to 40 nm or less.

Third Embodiment

FIGS. 14A-14D are diagrams showing the process of forming a contact hole according to a third embodiment of the present invention.

Figure 14A:
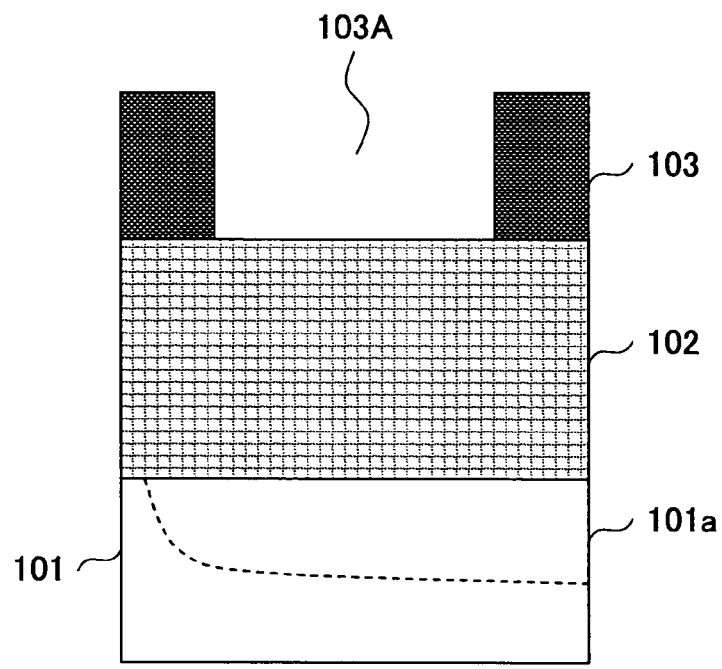
FIGS. 14A-14F are diagrams showing the fabrication process of a semiconductor device according to a third embodiment of the present invention.

Referring to FIG. 14A, there is formed a diffusion region 101a of p-type or n-type in a silicon substrate 101, and an insulation film 102 of $SiO_2$ or the like is formed on the surface of the silicon substrate 101. Particularly, it should be noted that the diffusion region 101a of FIG. 14A is formed, in view of possible application thereof to ultrahigh-speed semiconductor devices having the gate length of 90 nm or less, such that bottom edge of the diffusion region is located at a depth of 20 nm or less as measured from the substrate surface.

In the step of FIG. 14A, there is formed a resist pattern 103 having an opening 103A on the insulation film 102, and the insulation film 102 is removed by a dry etching process that uses an etching gas of CF or CHF family while using the resist pattern 103 as a mask. With this, there is formed a contact hole 102A in the insulation film 102 in correspondence to the resist opening 103A.

Figure 14B:
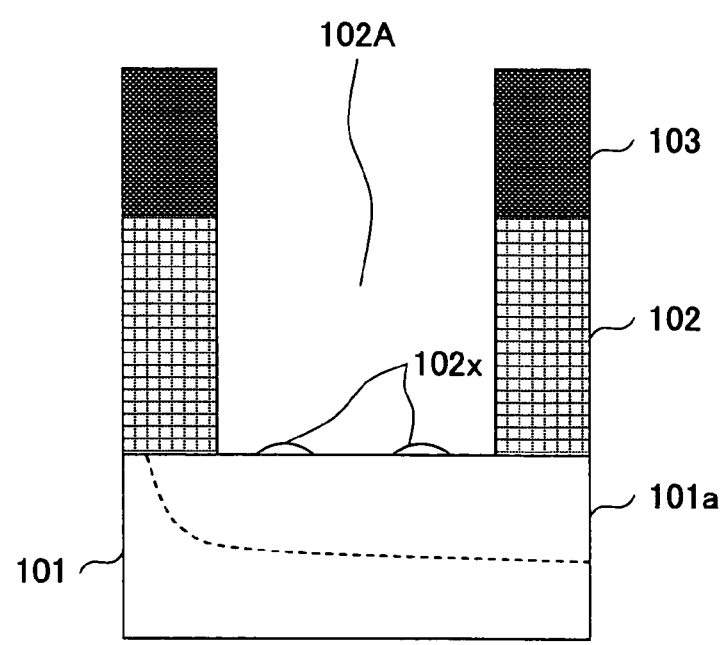

FIG. 14B shows the state just after the surface of the silicon substrate 101 is exposed as a result of the foregoing dry etching process. In this case, it will be noted that there remains a residue 102x of the insulation film 102 at the bottom of the contact hole 102A as a result of non-uniformity of the etching process.

Figure 14C:
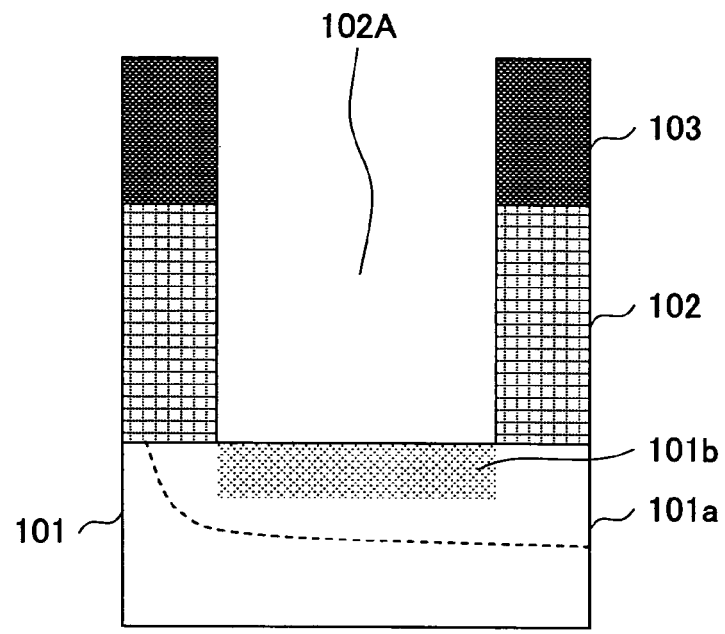

Thus, in the step of FIG. 14C, the dry etching process is continued and the overetching is conducted. With this, the residue 102x of the insulation film 102 is removed completely, while such a process also causes formation of a damaged layer 101b containing SiC at the surface of the silicon substrate in correspondence to the bottom part of the contact hole 102A as a result of injection of C in the etching gas into the silicon substrate 101.

Figure 14D:
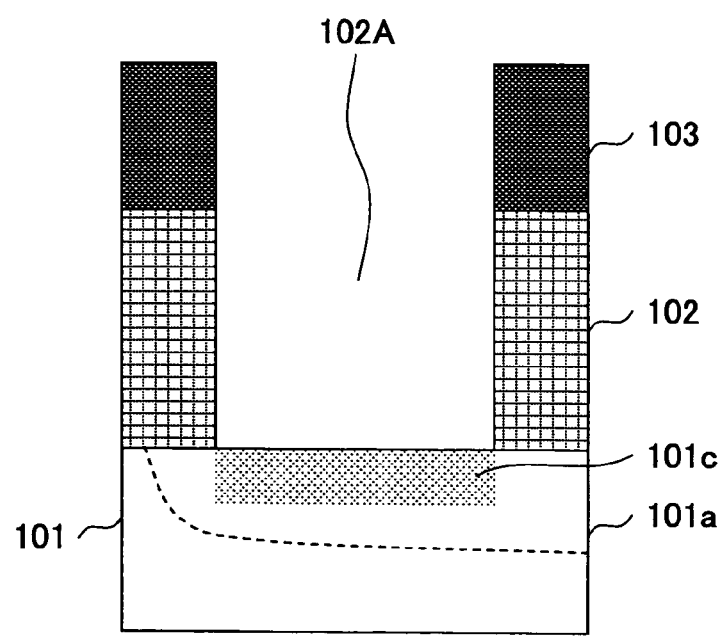

Thus, with present embodiment, a modifying processing is applied to the damaged layer 101b in the step of FIG. 14D by using the oxygen radicals, hydrogen radicals and the fluorine radicals under the condition such that there is caused no etching in the damaged layer 101b, and with this, at least a part of the damaged layer 101b is converted to a modified layer 101c formed primarily of $SiO_2$ and further containing SiOF or SiOH.

Figure 14E:
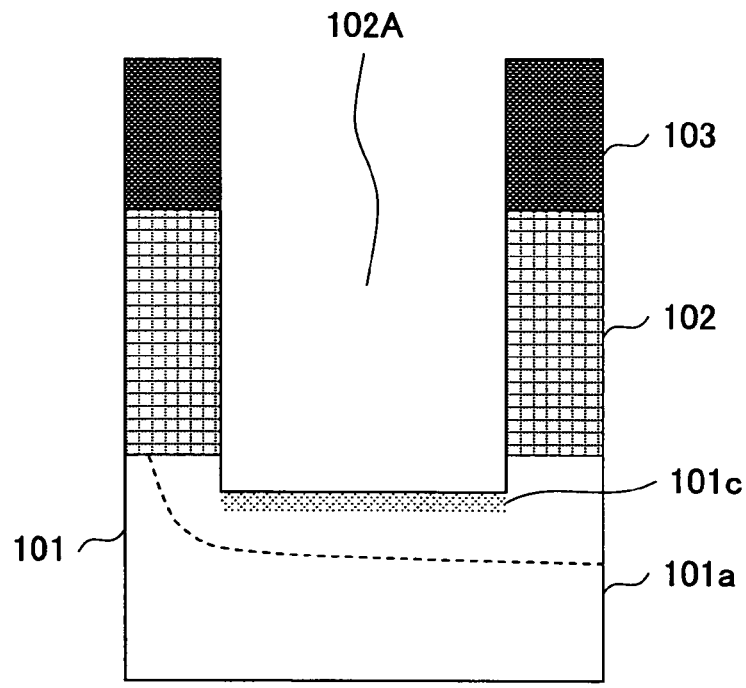

Further, in the step of FIG. 14E, the structure of FIG. 14D is treated with a wet etching process in a diluted hydrofluoric acid solution. Thereby the modified layer 101c is removed.

Figure 14F:
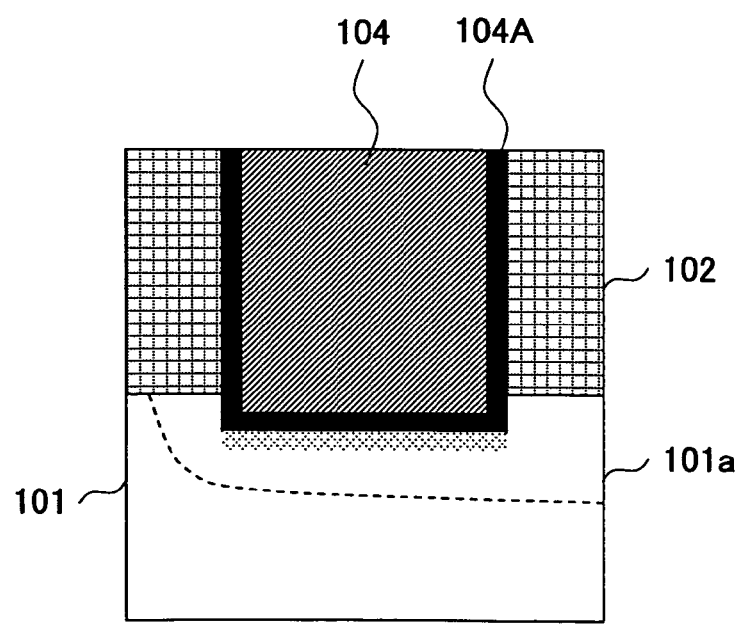

Further, in the step of FIG. 14F, the inner wall surface of the contact hole 12A is covered by an adhesion/diffusion barrier layer 104 of Ta/TaN, or the like, and a contact plug 104 is formed by filling the contact hole 12A with a metal such as W.

In the present embodiment, too, the encroachment at the bottom part of the contact hole 12A becomes minimum at the time of the step of removing the modified layer, and thus, it becomes possible to form a contact of low contact resistance while minimizing the effect caused in the shallow diffusion region 101a. With this, it becomes possible to minimize the wiring resistance in ultrafine high-speed semiconductor devices.

Further, while the present invention has been explained heretofore for the example of formation of sidewall insulation films and fine contact holes in ultra-fast semiconductor devices having a gate length of 90 nm or less, it should be noted that the present invention is applicable also to fabrication of various semiconductor devices including DRAMs having fine contact holes.

Further, in the modifying process of the present invention, it is possible to use other F-containing gases such as an $SF_6$ gas, in addition to the fluorocarbon gas as the source of the fluorine radicals.

Further, the present invention is not limited to the embodiments described heretofore, but various variations and modifications may be made without departing from the scope of the invention.

What is claimed is:

1. A method of fabricating a semiconductor device, comprising the steps of:
    exposing a semiconductor crystal layer to plasma that uses a gas containing carbon, said step of exposing said semiconductor crystal layer to plasma causes formation of a damaged layer containing carbon at a surface portion of said semiconductor crystal layer as a result of injection of carbon contained in said gas into said semiconductor crystal layer;
    modifying said damaged layer by exposing said damaged layer to oxygen radicals to form a modified layer; and
    removing said modified layer by a wet etching process,
    said modifying step being conducted by adding to said damaged layer an active specie of an element that would obstruct formation of double bond between a Si atom and an oxygen atom by causing a chemical bond with Si atoms on said surface portion of said semiconductor crystal layer.

2. The method as claimed in claim 1, wherein said surface portion of said semiconductor crystal layer includes Si atoms, and wherein said damaged layer contains SiC.

3. The method as claimed in claim 1, wherein said surface portion of said semiconductor crystal layer is a silicon substrate surface.

4. The method as claimed in claim 1, wherein said surface portion of said semiconductor crystal layer is a polysilicon film surface.

5. The method as claimed in claim 1, wherein said modifying step is conducted under a condition in which there occurs no substantial etching in said damaged layer.

6. The method as claimed in claim 1, wherein said element is selected from hydrogen and halogen.

7. The method as claimed in claim 1, wherein said element is any of hydrogen and fluorine.

8. The method as claimed in claim 7, wherein said oxygen radicals are formed by exciting an oxygen gas with plasma, and wherein said active specie of fluorine is formed by exciting any of a fluorocarbon gas or an $SF_6$ gas.

9. The method as claimed in claim 8, wherein said fluorocarbon gas contains $CF_4$.

10. The method as claimed in claim 1, wherein said modifying step is conducted without applying a substrate bias to a semiconductor substrate having said surface portion of said semiconductor crystal layer.

11. The method as claimed in claim 1, further comprising a step, after said wet etching step, of introducing an impurity element to said surface portion of said semiconductor crystal layer by an ion implantation process.

12. The method as claimed in claim 1, further comprising the step of forming a silicide layer on said surface portion of said semiconductor crystal layer.

13. The method as claimed in claim 1, wherein said wet etching process is conducted by using HF as an etchant.

14. A method of fabricating a semiconductor device, comprising the steps of:
    exposing a semiconductor crystal layer covered with an insulation film by removing said insulation film by a dry etching process that uses a fluorocarbon gas as an etching gas, said dry etching process exposes a surface portion of said semiconductor crystal layer to plasma and causes formation of a damaged layer as a result of injection of carbon contained in said fluorocarbon gas into said semiconductor crystal layer;
    modifying said damaged layer to form a modified layer;
    removing said modified layer by a wet etching process,
    said modifying step being conducted by adding to said damaged layer an active specie of an element that would obstruct formation of double bond between a Si atom and an oxygen atom by causing a chemical bond with Si atoms on said surface portion of said semiconductor crystal layer.

15. The method as claimed in claim 14, wherein said wet etching process is conducted by using HF as an etchant.

16. A method of fabricating a semiconductor device, comprising the steps of:
    forming an insulation film on a surface portion of a semiconductor crystal layer so as to cover a polysilicon gate electrode formed on said surface portion of said semiconductor crystal layer;
    forming sidewall insulation films at both sidewalls of said polysilicon gate electrode by etching back said insulation film with a dry etching process that uses a fluorocarbon gas as an etching gas such that said surface portion of said semiconductor crystal layer is exposed and such that a top surface of said polysilicon gate electrode is exposed, said dry etching process exposes said surface portion of said semiconductor crystal layer to plasma and causes formation of a damaged layer at said surface portion as a result of injection of carbon contained in said fluorocarbon gas into said semiconductor crystal layer;
    modifying said damaged layer to form a modified layer by exposing said damaged later to oxygen radicals; and
    removing said modified layer by a wet etching process,
    said modifying step being conducted by adding to said damaged layer an active specie of an element that would obstruct formation of double bond between a Si atom and an oxygen atom by causing a chemical bond with Si atoms on said surface portion of said semiconductor crystal layer.

17. The method as claimed in claim 16, wherein said gate electrode has a gate length of 90 nm or less.

18. The method as claimed in claim 16, wherein said wet etching process is conducted by using HF as an etchant.

* * * * *